US012322716B2

(12) United States Patent
Chen et al.

(10) Patent No.: US 12,322,716 B2
(45) Date of Patent: Jun. 3, 2025

(54) HEAT DISSIPATING FEATURES FOR LASER DRILLING PROCESS

(71) Applicant: Taiwan Semiconductor Manufacturing Co., Ltd., Hsinchu (TW)

(72) Inventors: Chien-Hung Chen, Hsinchu (TW); Cheng-Pu Chiu, Hsinchu (TW); Chien-Chen Li, Hsinchu (TW); Chien-Li Kuo, Hsinchu (TW); Ting-Ting Kuo, Hsinchu (TW); Li-Hsien Huang, Zhubei (TW); Yao-Chun Chuang, Hsinchu (TW); Jun He, Zhubei (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 512 days.

(21) Appl. No.: 17/826,519

(22) Filed: May 27, 2022

(65) Prior Publication Data

US 2023/0290747 A1 Sep. 14, 2023

Related U.S. Application Data

(60) Provisional application No. 63/269,130, filed on Mar. 10, 2022.

(51) Int. Cl.
*H01L 23/00* (2006.01)
*H01L 21/48* (2006.01)
(Continued)

(52) U.S. Cl.
CPC .......... *H01L 24/06* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 23/5389* (2013.01); *H01L 24/20* (2013.01); *H01L 25/105* (2013.01); *H01L 2221/68359* (2013.01);
(Continued)

(58) Field of Classification Search
CPC ......... H01L 2224/06519; H01L 23/367; H01L 2225/06589; H01L 2224/0231; H01L 2224/02331; H01L 2224/0235; H01L 2224/02381
See application file for complete search history.

(56) References Cited

U.S. PATENT DOCUMENTS

| | | | |
|---|---|---|---|
| 9,000,584 | B2 | 4/2015 | Lin et al. |
| 9,048,222 | B2 | 6/2015 | Hung et al. |

(Continued)

FOREIGN PATENT DOCUMENTS

| | | | |
|---|---|---|---|
| KR | 20210059470 | A | 5/2021 |
| KR | 20220013891 | A | 2/2022 |
| WO | 2016029830 | A1 | 3/2016 |

*Primary Examiner* — Syed I Gheyas
(74) *Attorney, Agent, or Firm* — Slater Matsil, LLP

(57) ABSTRACT

Embodiments provide metal features which dissipate heat generated from a laser drilling process for exposing dummy pads through a dielectric layer. Because the dummy pads are coupled to the metal features, the metal features act as a heat dissipation feature to pull heat from the dummy pad. As a result, reduction in heat is achieved at the dummy pad during the laser drilling process.

20 Claims, 27 Drawing Sheets

(51) Int. Cl.

| | |
|---|---|
| ***H01L 21/56*** | (2006.01) |
| ***H01L 21/683*** | (2006.01) |
| ***H01L 23/31*** | (2006.01) |
| ***H01L 23/538*** | (2006.01) |
| ***H01L 25/10*** | (2006.01) |

(52) U.S. Cl.

CPC ............... *H01L 2224/06519* (2013.01); *H01L 2224/214* (2013.01); *H01L 2225/1035* (2013.01); *H01L 2225/1058* (2013.01); *H01L 2225/1094* (2013.01)

(56) References Cited

U.S. PATENT DOCUMENTS

| | | | | |
|---|---|---|---|---|
| 9,048,233 | B2 | 6/2015 | Wu et al. | |
| 9,064,879 | B2 | 6/2015 | Hung et al. | |
| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,368,460 | B2 | 6/2016 | Yu et al. | |
| 9,372,206 | B2 | 6/2016 | Wu et al. | |
| 9,496,189 | B2 | 11/2016 | Yu et al. | |
| 2003/0164543 | A1* | 9/2003 | Kheng Lee | H01L 23/4334 257/E23.105 |
| 2016/0056184 | A1 | 2/2016 | Wei et al. | |
| 2016/0329262 | A1* | 11/2016 | Hsiao | H01L 23/49894 |
| 2019/0287924 | A1* | 9/2019 | Moon | H01L 24/82 |
| 2021/0151411 | A1 | 5/2021 | Cho | |
| 2022/0028842 | A1 | 1/2022 | Chang et al. | |

* cited by examiner

HEAT DISSIPATING FEATURES FOR LASER DRILLING PROCESS

PRIORITY CLAIM AND CROSS-REFERENCE

This application claims the benefit of the following provisionally filed U.S. Patent application: Application No. 63/269,130, filed on Mar. 10, 2022, and entitled "RDL Routing Structure," which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a trend for smaller and more creative packaging techniques of semiconductor dies has emerged. An example of such packaging systems is Package-on-Package (POP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

In some packaging processes, device dies are sawed from wafers before they are packaged, wherein redistribution lines are formed to connect to the device dies. An advantageous feature of this packaging technology is the possibility of forming fan-out packages, which means the I/O pads on a die can be redistributed to a greater area than the die, and hence the number of I/O pads on the surfaces of the dies can be increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
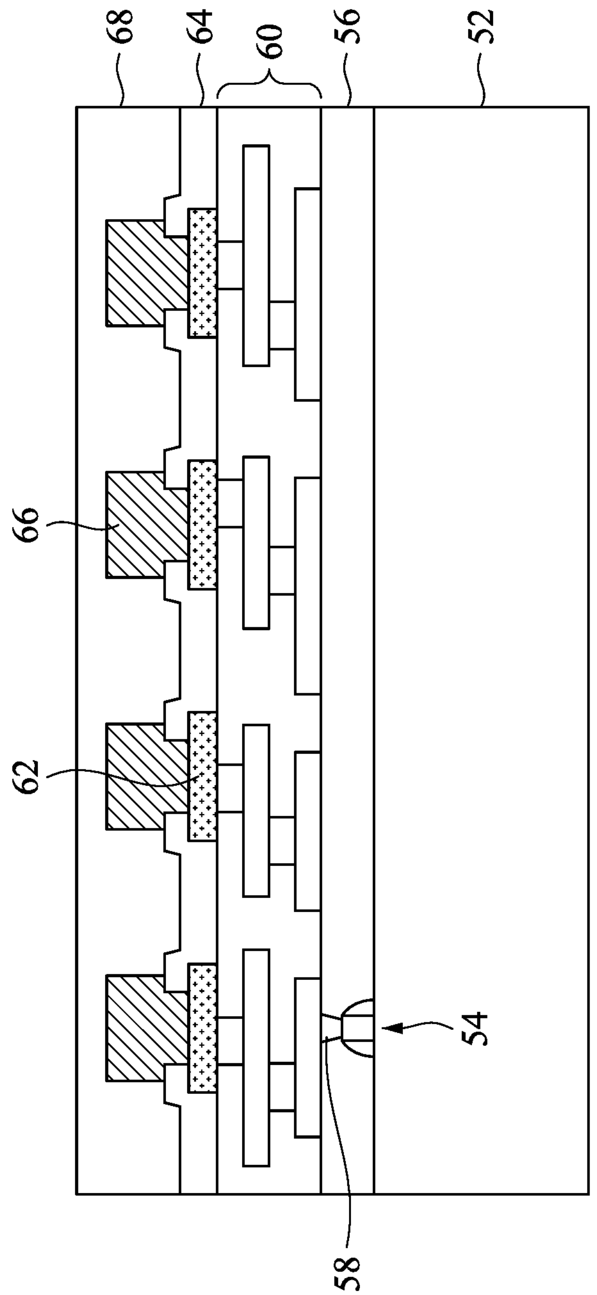
FIG. 1 illustrates a cross-sectional view of an integrated circuit die, in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Dummy pads may be included in a backside pad layer of a die package. The backside pad layer may be buried beneath a dielectric layer. After the front side structures of the die package are formed, the die package may be flipped over and the buried pads of the backside pad layer revealed through the dielectric layer by a laser drilling process. Embodiments provide integrated heat dispersion for dummy pads so that when the laser contacts the dummy pads in the backside pad layer, potential damage to the dummy pads or pad layer may be reduced or eliminated by providing sufficient heat dispersion. Embodiments provide several options for physically coupling the dummy pads to other isolated (electrically floating or electrically disconnected) metal features in the die package. In one embodiment, the dummy pads are connected to a wide metal in the backside pad layer, while the active pads remain isolated from the wide metal. In one embodiment, the dummy pads are physically coupled to a redistribution structure which provides coupling to other dummy pads, a mesh metal, a bulk metal, a comb metal, dummy metal routing, or any combination thereof. The heat from the laser-drilling process can be dissipated using the redistribution structure and additional metal into the surrounding materials.

Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIG. 1 illustrates a cross-sectional view of an integrated circuit die 50 in accordance with some embodiments. The integrated circuit die 50 will be packaged in subsequent processing to form an integrated circuit package or die package. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a backside.

Devices (represented by a transistor) 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines and vias formed in one or more low-k dielectric layers. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 50.

Optionally, solder regions (e.g., solder balls or solder bumps) may be disposed on the pads 62. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing and are packaged, and dies, which fail the CP testing, are not packaged. After testing, the solder regions may be removed in subsequent processing steps.

A dielectric layer 68 may (or may not) be on the active side of the integrated circuit die 50, such as on the passivation films 64 and the die connectors 66. The dielectric layer 68 laterally encapsulates the die connectors 66, and the dielectric layer 68 is laterally coterminous with the integrated circuit die 50. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may bury the solder regions as well. Alternatively, the solder regions may be removed prior to forming the dielectric layer 68.

The dielectric layer 68 may be a polymer such as PBO, polyimide, BCB, or the like; a nitride such as silicon nitride or the like; an oxide such as silicon oxide, PSG, BSG, BPSG, or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

In some embodiments, the integrated circuit die 50 is a stacked device that includes multiple semiconductor substrates 52. For example, the integrated circuit die 50 may be a memory device such as a hybrid memory cube (HMC) module, a high bandwidth memory (HBM) module, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 60.

FIGS. 2 through 17 and FIGS. 21 through 26 illustrate the cross-sectional or plan views of intermediate stages in the formation of a package including one or more common metal features connected by a metal connection to dummy pads, in accordance with some embodiments of the present disclosure. The corresponding processes are also reflected schematically in the process flow shown in FIG. 27.

Figure 2:
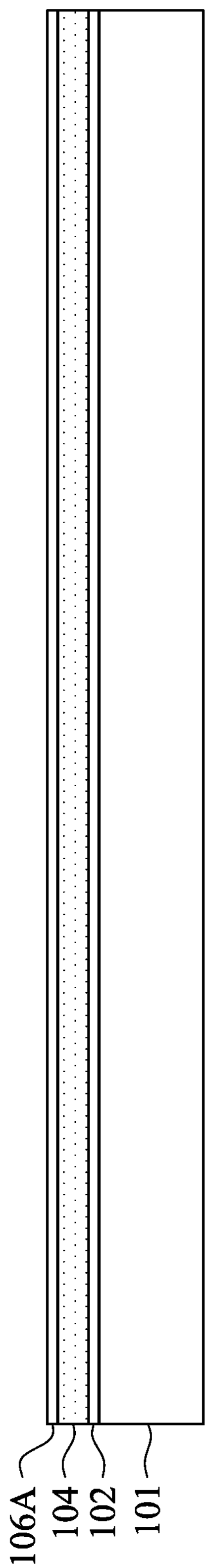
FIGS. 2 through 17 and FIGS. 21 through 26 illustrate various cross-sectional views and top down or plan views of intermediate steps during a process for forming a package component, in accordance with some embodiments.

Referring to FIG. 2, carrier 101 is provided, and release film 102 is coated on carrier 101. Carrier 101 may be formed of a transparent material, and may be a glass carrier, a ceramic carrier, or the like. Release film 102 may be formed of a Light-To-Heat-Conversion (LTHC) coating material, and may be applied onto carrier 101 through coating. In accordance with some embodiments of the present disclosure, the LTHC coating material is capable of being decomposed under the heat of light/radiation (such as laser), and hence can release carrier 101 from the structure formed thereon.

In accordance with some embodiments, as shown in FIG. 2, dielectric layer 104 is formed on release film 102. Dielectric layer 104 may be formed of or comprise a polymer such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, CVD, laminating, the like, or a combination thereof. Dielectric layer 104 provides good planarity to serve as a level base to construct overlying features.

Metal seed layer 106A is deposited over dielectric layer 104. The respective process is illustrated as process 402 in the process flow 400 shown in FIG. 27. In accordance with some embodiments, metal seed layer 102A includes a titanium layer and a copper layer over the titanium layer. The metal seed layer may be formed through, for example, Physical Vapor Deposition (PVD), Chemical Vapor Deposition (CVD), or the like.

Figure 3:
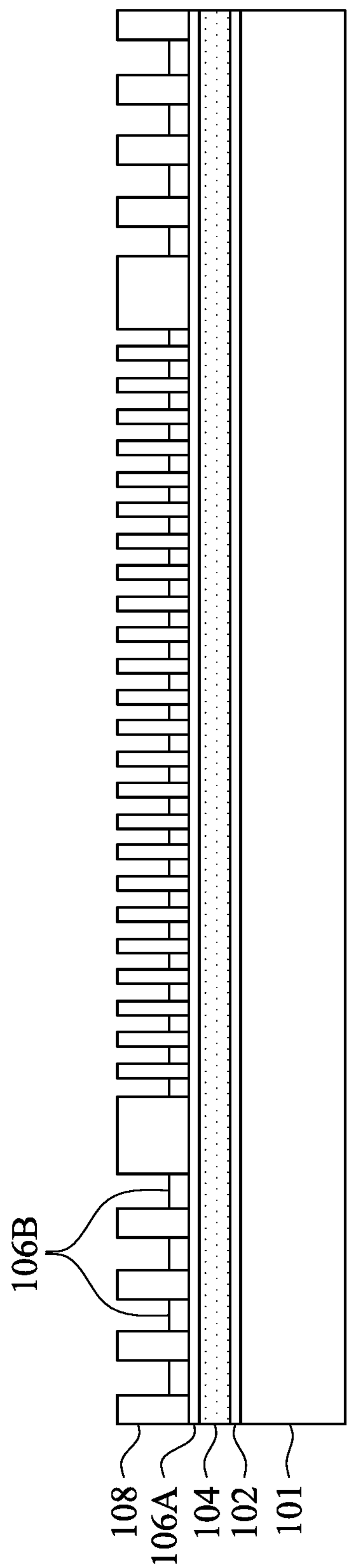

Next, as shown in FIG. 3, a patterned plating mask 108 is applied and patterned. The respective process is illustrated as process 404 in the process flow 400 shown in FIG. 27. In accordance with some embodiments, the patterned plating mask 108 comprises a patterned photo resist. In accordance with alternative embodiments, plating mask 108 comprises a dry film, which is laminated and then patterned. Some portions of metal seed layer 106A are exposed through the patterned plating mask 108.

Still referring to FIG. 3, next, metallic material 106B is deposited on the exposed portions of metal seed layer 106A. The respective process is illustrated as process 406 in the process flow 400 shown in FIG. 27. The deposition process may include a plating process, which may be an electrochemical plating process, an electroless plating process, or the like. Metallic material 106B may include Cu, Al, Ti, W, Au, or the like. After the plating process, the patterned plating mask 108 is removed, exposing the underlying portions of metal seed layer 106A. The respective process is illustrated as process 408 in the process flow 400 shown in FIG. 27. The patterned plating mask 108 may be removed by an acceptable ashing or stripping process, such as using an oxygen plasma or the like.

Figure 4:
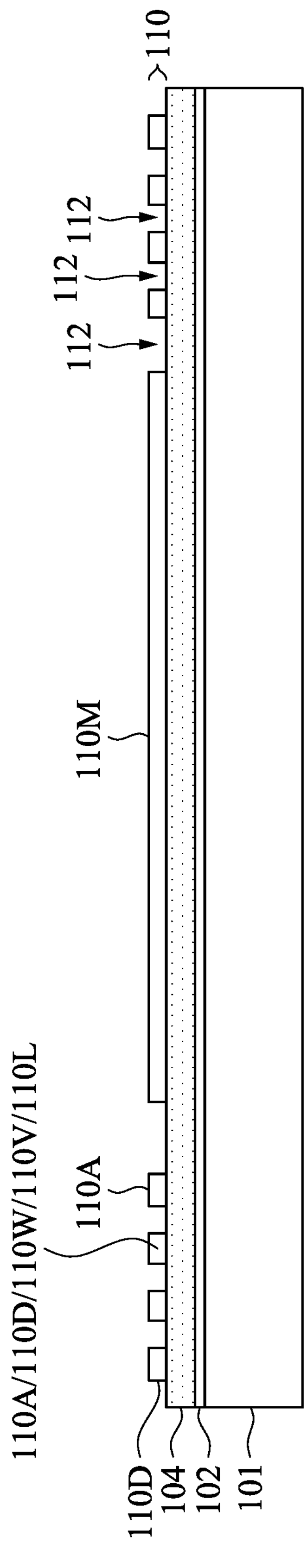

The exposed portions of metal seed layer 106A are then removed, such as by using an acceptable etching process, such as by wet or dry etching, and the remaining portions of the metal seed layer 106A and metallic material 106B together become a metal layer 110 (or conductive features 110), as shown in FIG. 4. The metal layer 110 may include several different types of metal features, including for example, a metal mesh 110M, active pads 110A, dummy pads 110D, pad bridges 110B (see FIG. 7), metal lines 110L, and/or a wide metal 110W (see FIG. 7). The respective process is also illustrated as process 408 in the process flow 400 shown in FIG. 27. In some embodiments, the metal mesh 110M is positioned so as to be aligned with a subsequently placed integrated circuit die 50 and can help to provide heat dispersion capabilities. In some embodiments, the metal mesh 110M can be replaced with a bulk metal, dummy metal lines, a metal comb, the like, or combinations thereof. Examples of these types of structures are discussed in connection with FIG. 10, below.

Figure 5:
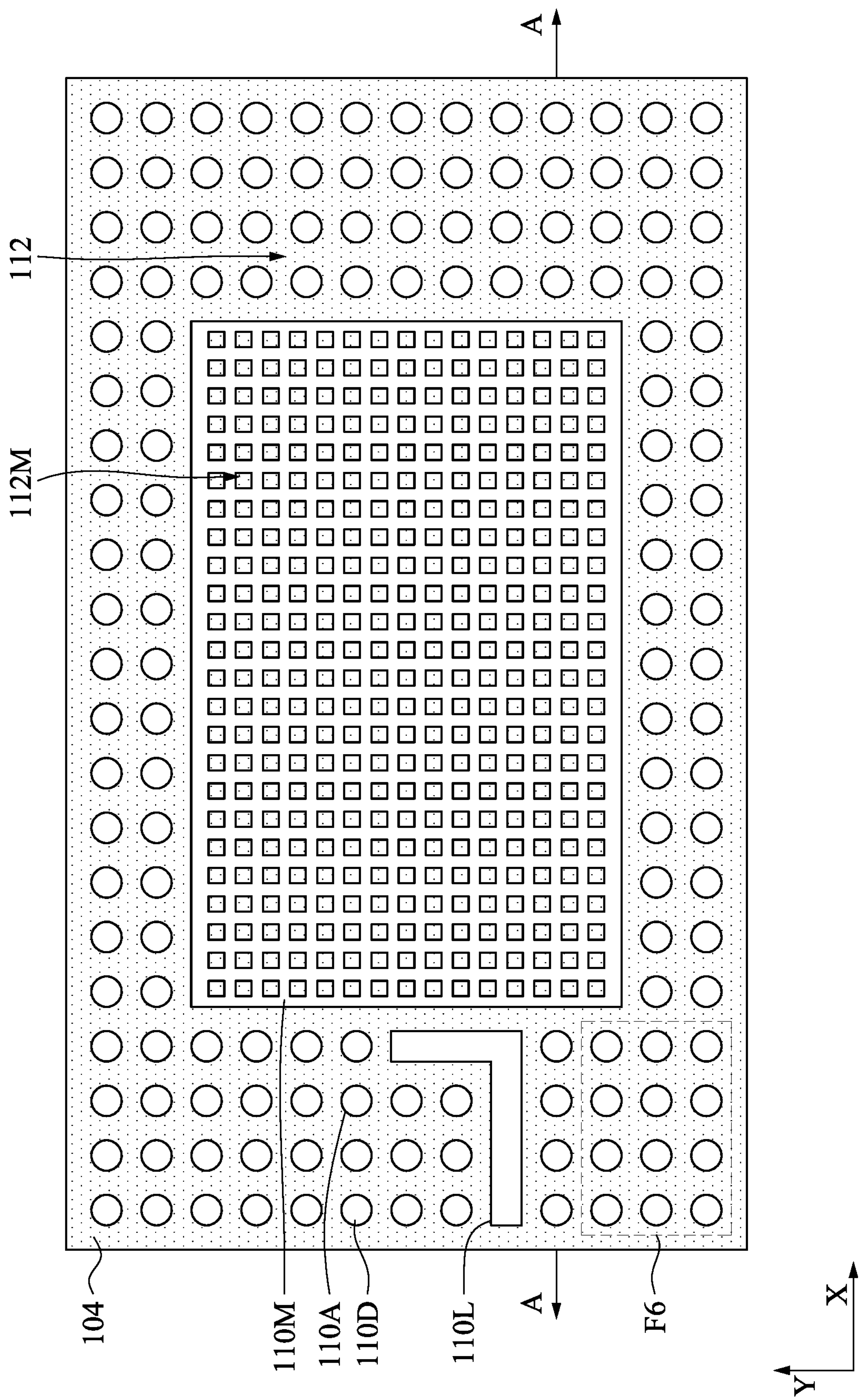

FIG. 5 illustrates a top view of the structure illustrated in FIG. 4. The cross-sectional view shown in FIG. 2 is an example which may be obtained from cross-section A-A in FIG. 5. In accordance with some embodiments, the metal mesh 110M includes a plurality of strips having lengthwise directions in the X-direction, and a plurality of strips having lengthwise directions in the Y-direction, which may be (or may not be) perpendicular to the X-direction. These sets of plurality of strips define a plurality of openings 112M therein. In accordance with some embodiments, the plurality of openings 112M form an array, and may have same sizes. The plurality of strips have crossing areas, which are the areas in which the X-direction and Y-direction plurality of strips overlap. Other openings 112 include any areas not covered by the metal layer 110, and may be found, for example, between dummy pads 110D and/or active pads 110A or surrounding dummy pads 110D and/or active pads 110A.

Figure 6:
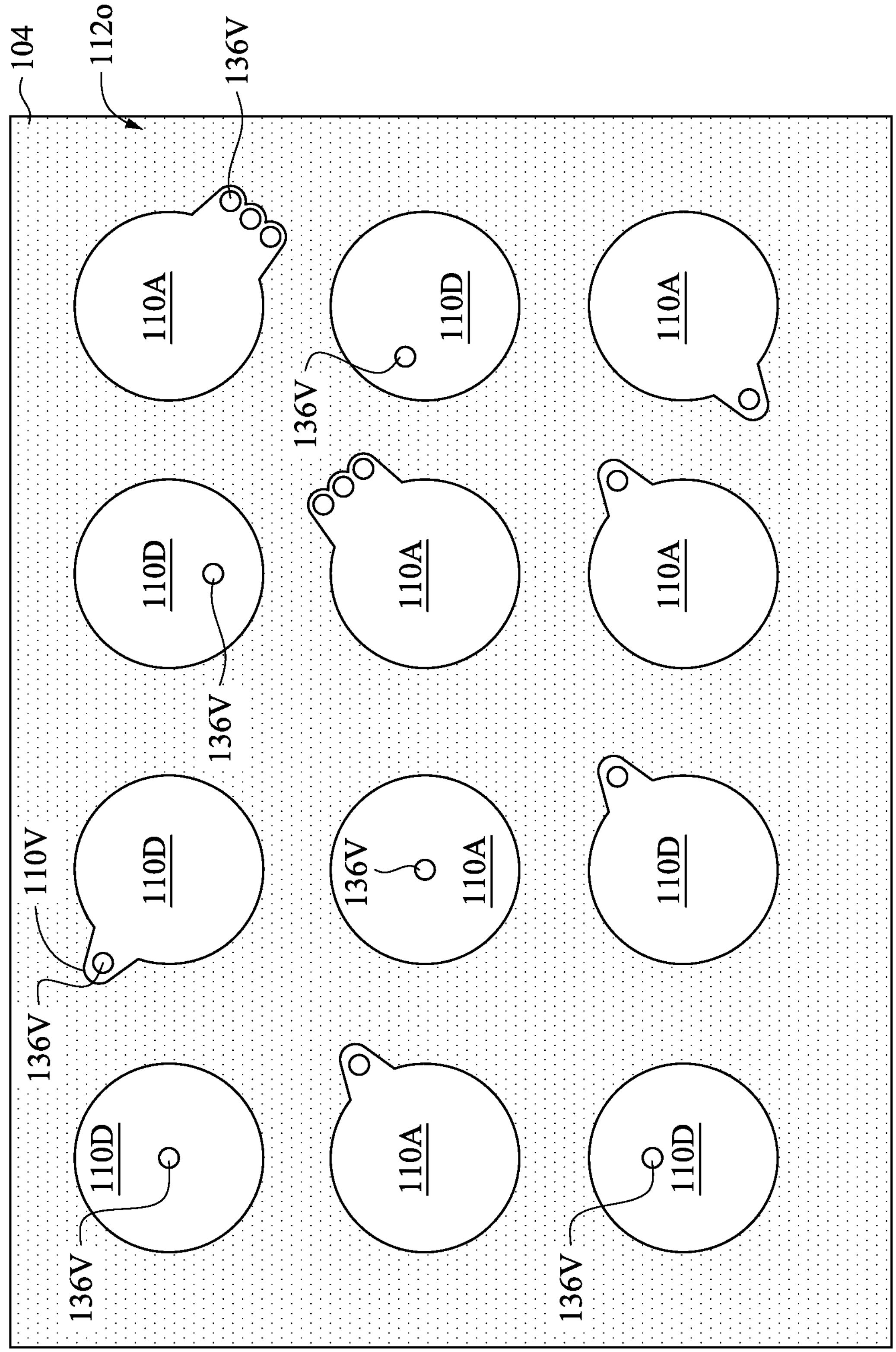

FIG. 6 illustrates an enlarged view of the box labeled F6 in FIG. 5, in accordance with some embodiments. The active pads 110A and dummy pads 110D may have elongated portions 110V which protrude laterally from the respective active pad 110A or dummy pad 110D. The elongated portions 110V provides a place for a subsequently formed via 136V to land. In some embodiments the subsequently formed via 136V may land directly on the main portion of the active pad 110A or dummy pad 110D. In some embodiments, the active pad 110A and/or dummy pad 110D may include multiple elongated portions 110V and several vias 136V may be used for one or more of the active pads 110A and/or dummy pads 110D.

Figure 7:
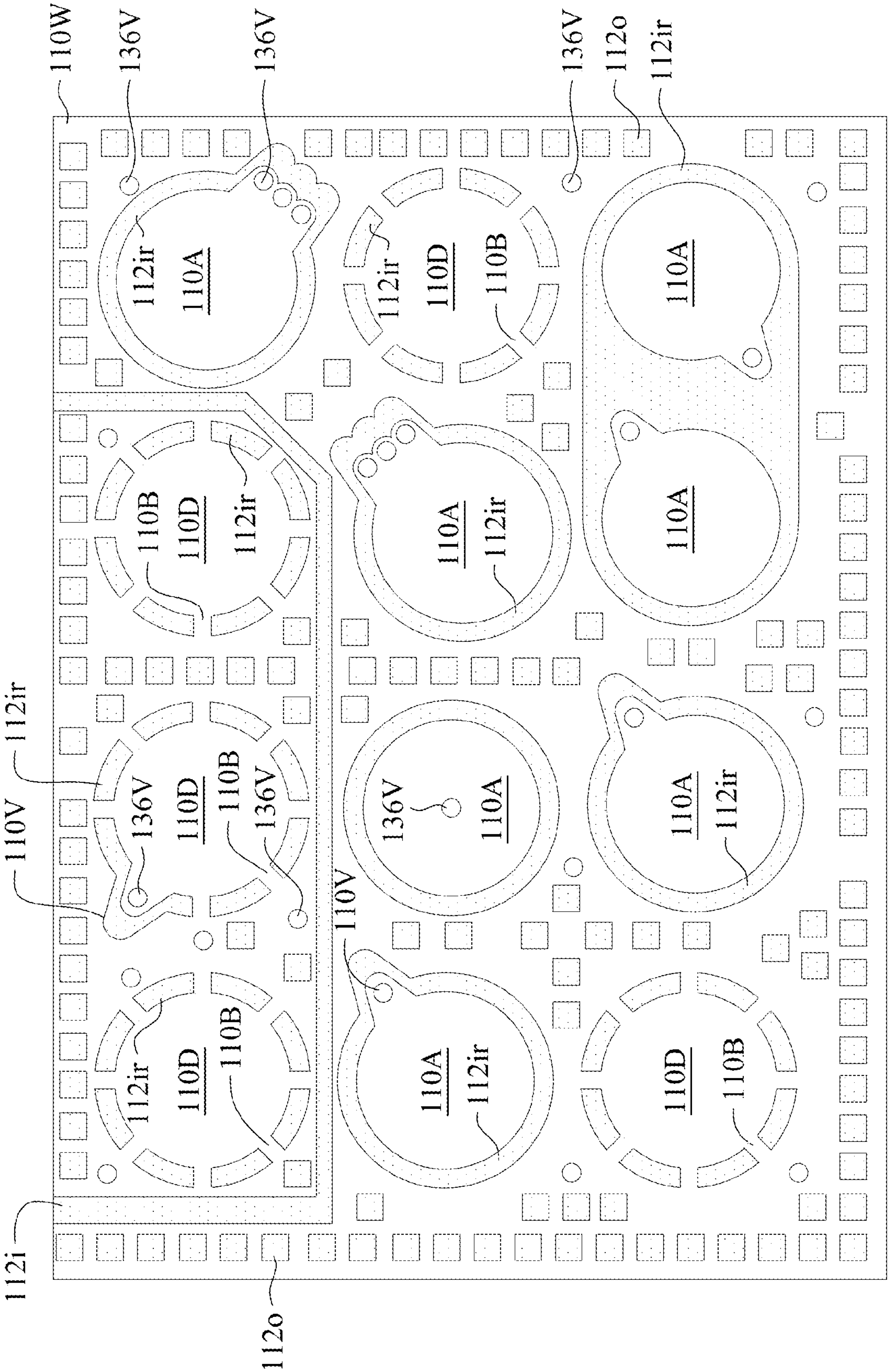

As illustrated in FIG. 7, in some embodiments, a wide metal 110W structure may be formed over the dielectric layer 104. The wide metal 110W provides large metal surface and thermal bulk for heat dissipation. Some of the wide metal 110W may be reserved for a power plane or a ground plane. Some of the wide metal 110W may be electrically floating, i.e., electrically isolated from any power, ground, or signal sources. Isolation regions 112*i* may separate the various sections of the wide metal 110W. Isolation rings 112*ir* may surround individual active pads 110A and/or dummy pads 110D or a plurality of active pads 110A and/or dummy pads 110D. Openings 1120 may be dispersed in an interrupted pattern or randomly throughout the wide metal 110W.

The dummy pads 110D may be physically coupled to the wide metal 110W by pad bridges 110B, the pad bridges 110B providing thermally conductive paths to the wide metal 110W to help disperse heat which may be generated from a subsequent laser drilling process. The pad bridges 110B may have a length between about 8 μm and about 200 μm, depending on the spacing of the dummy pad 110D to the wide metal 110W. The width of the pad bridges 110B across the spacing between the dummy pad 110D and the wide metal 110W may be between about 10 μm and about 50 μm, though other values may be used. The pad bridges 110B may be formed at the same time as the dummy pads 110D and wide metal 110W. Each of the dummy pads 110D may include several pad bridges 110B to the wide metal 110W. In some embodiments, for example, the number of pad bridges 110B may be between 4 and 12 for each dummy pad 110D, though more or fewer pad bridges 110B may be used. As indicated in FIG. 7, the subsequently formed vias 136V may be coupled directly to the wide metal 110W, providing further physically coupling and thermal coupling to a subsequently formed redistribution structure. It should be understood that the features illustrated in FIG. 7 may be combined without limitation as needed to achieve a particular design.

In some embodiments, rather than have some dummy pads 110D completely isolated from every other metal feature, none of the dummy pads 110D may remain isolated from any other feature. In other words, every dummy pad 110D is connected to another metal feature, such as the wide metal 110W or a metal via to a metal feature in another metal layer (e.g., metal layer 136, described below with respect to FIGS. 9 and 10), and is not limited thereto.

Figure 8:
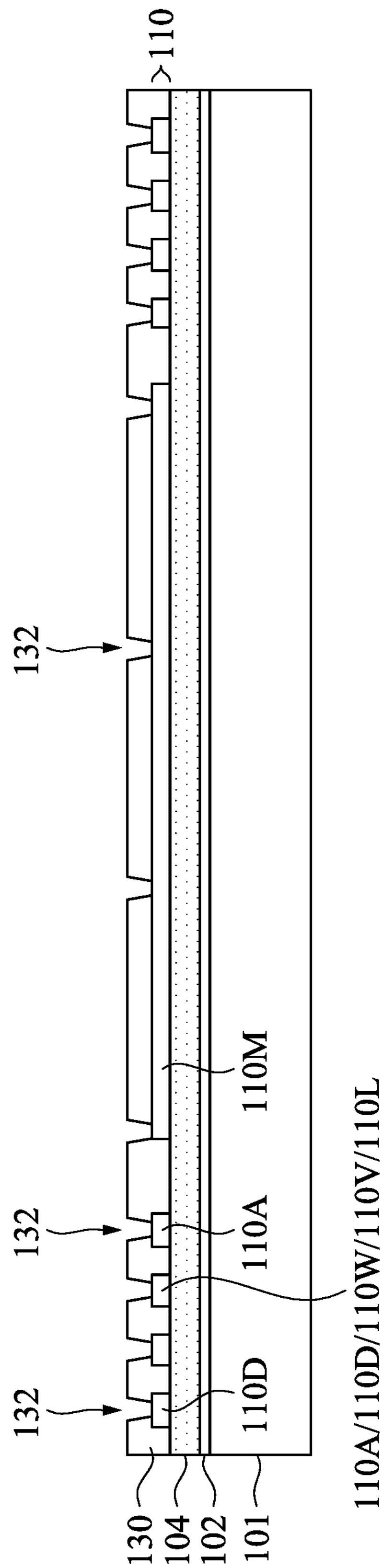

Referring to FIG. 8, dielectric layer 130 is formed on the metal layer 110. The respective process is illustrated as process 410 in the process flow 400 shown in FIG. 27. The bottom surface of dielectric layer 130 is in contact with the top surfaces of metal mesh 110M, active pads 110A, dummy pads 110D, wide metal 110W (if used), and pad bridges 110B (if used), and so forth. In accordance with some embodiments of the present disclosure, dielectric layer 130 is formed of or comprises a polymer, which may be a photo-sensitive material such as PBO, polyimide, BCB, or the like. In accordance with alternative embodiments, dielectric layer 130 is formed of an inorganic dielectric material, which may include a nitride such as silicon nitride, or an oxide such as silicon oxide, phosphosilicate glass (PSG), borosilicate glass (BSG), boron-doped phosphosilicate glass (BPSG), fluorine-doped silicate glass (FSG), or the like.

In accordance with some embodiments, the formation of dielectric layer 130 includes dispensing dielectric layer 130 in a flowable form, and then curing the flowable dielectric layer 130 to solidify it. Dielectric layer 130 is then patterned to form openings 132 therein, thereby exposing portions of the dummy pads 110D, active pads 110A, metal lines 110L, elongated portions 110V, wide metal 110W (if used), metal mesh 110M, and/or combinations thereof. The patterning may be performed by an acceptable process, such as by exposing the dielectric layer 130 to light when the dielectric layer 130 is a photo-sensitive material or by etching using, for example, an anisotropic etch. If the dielectric layer 130 is a photo-sensitive material, the dielectric layer 130 can be developed after the exposure.

Figure 9:
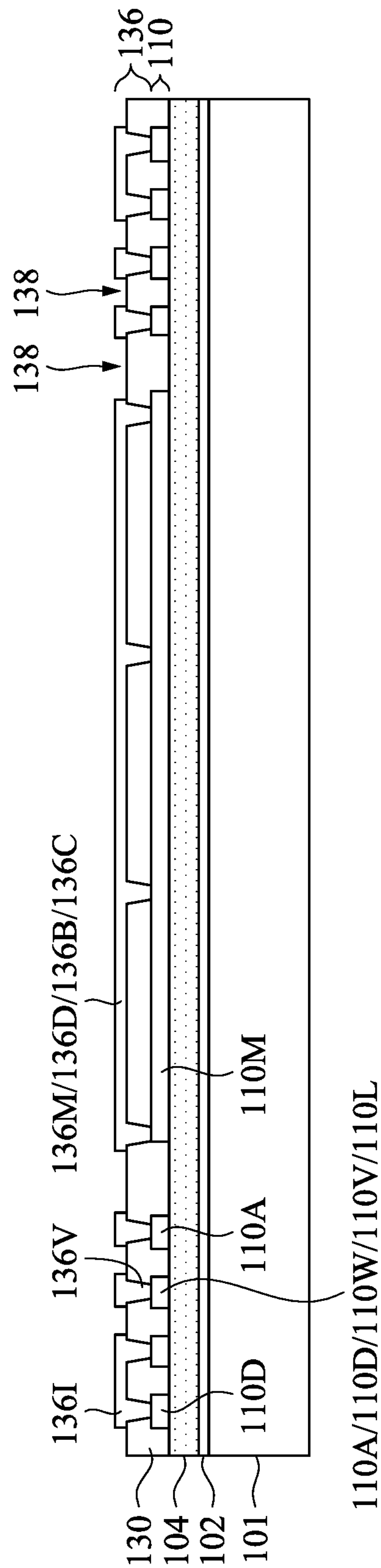
Figure 10:
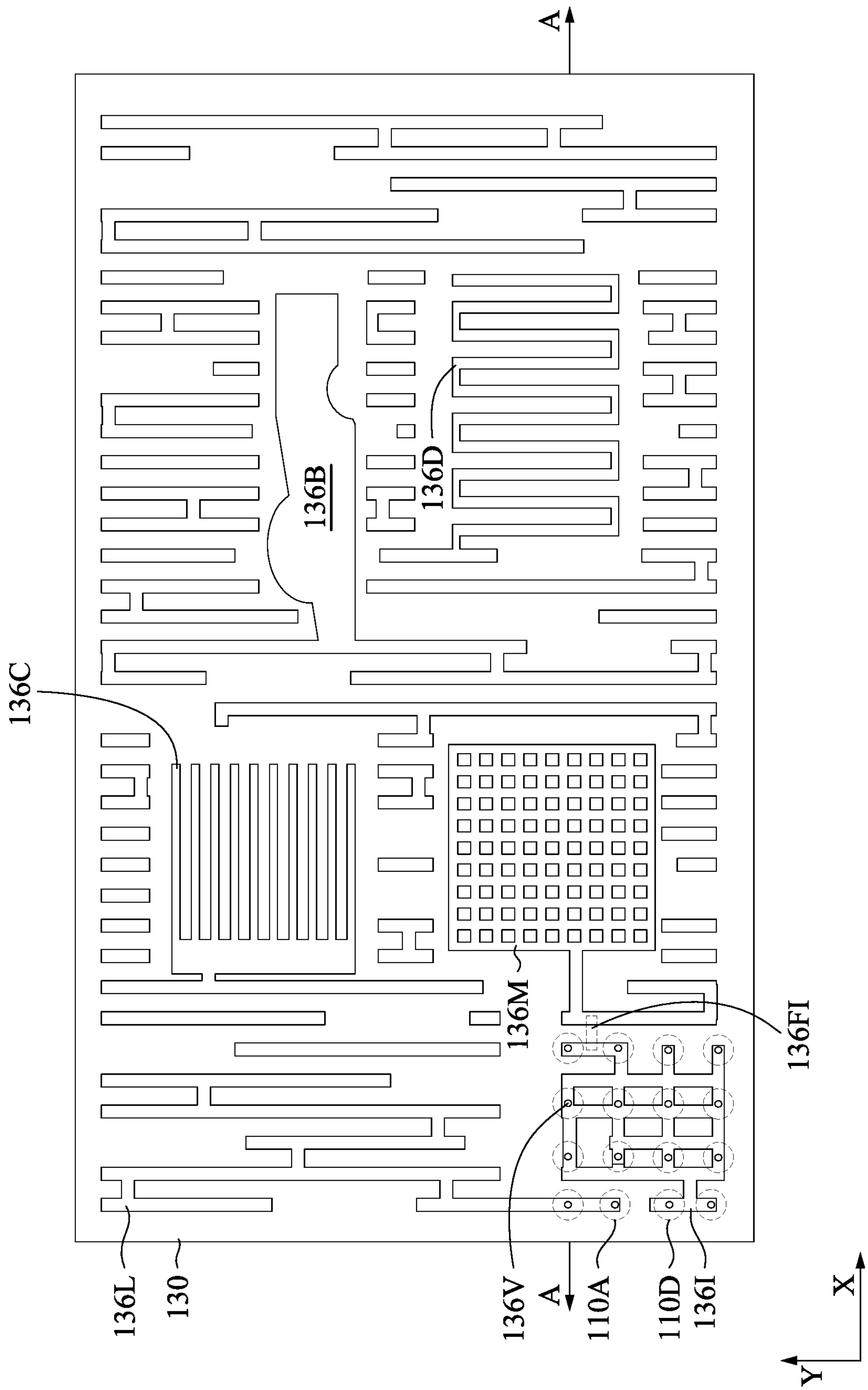

FIGS. 9 and 10 illustrates the formation of metal layer 136 (which is also collectively referred to as conductive features 136), which may include redistribution lines 136L, metal vias 136V, and optionally one or more of a dummy interconnect 136I, metal mesh 136M, dummy routing 136D, bulk metal 136B, or metal comb 136C. The respective process is illustrated as process 412 in the process flow 400 shown in FIG. 27. For example, metal layer 136 may include redistribution lines 136L over dielectric layer 130 and vias portion (also referred to as vias) 136V extending through the dielectric layer 130 to contact physically and electrically the metal layer 110. The formation of metal layer 136 may adopt processes and materials similar to those for forming the metal layer 110. Also, each of vias 136V may have a tapered profile, with the upper portions being wider than the corresponding lower portions. The vias 136V may land on any of the dummy pads 110D, active pads 110A, metal lines 110L, elongated portions 110V, wide metal 110W (if used), metal mesh 110M, and/or combinations thereof.

FIG. 10 illustrates an example top view of the metal layer 136, in accordance with some embodiments. Some features are omitted for clarity. As noted above, the metal layer 136 may optionally include one or more of a dummy interconnect 136I, metal mesh 136M, dummy routing 136D, bulk metal 136B, or metal comb 136C. When utilized, these features provide heat dissipation properties for a subsequent laser drilling process, such as discussed in greater detail below.

The metal mesh 136M is a grid of interconnecting metal lines. The metal mesh 136M may similar to the metal mesh 110M, such as described above. The metal mesh 136M may be about the same size as the metal mesh 110M or may be larger or smaller. In some embodiments, the metal mesh 136M may be aligned to the metal mesh 110M or may be offset from the metal mesh 110M.

The bulk metal 136B is a wide metal that has a length and width which exceed the line width for redistribution lines 136L. For example, the bulk metal 136B may have a width and length footprint which is between 2 and 100 times the line width of the redistribution lines 136L. Or, in another example, the bulk metal 136B may have a top view surface area which is greater than the top view surface area of one of the redistribution lines 136L leading to the bulk metal 136B. The bulk metal 136B may also have angled or curved sides in top down view, so as to fit a particular area amongst redistribution lines 136L.

The metal comb 136C has multiple parallel lines which are connected at one or both ends by a bulk metal or a perpendicular line. The metal comb 136C provides a large surface area interface with a surrounding overlying dielectric material which is subsequently deposited over the metal layer 136.

The dummy routing 136D includes routed lines which may be routed in a pattern or which may be routed randomly and which are coupled only to dummy pads 110D. The dummy routing 136D may also include inefficient routing to provide more metal mass for the routing and more routed linear distance between two dummy pads 110D. For example, the dummy routing 136D may provide linear routed distance between two dummy pads 110D which is between 2 and 50 times further than the shortest linear distance between the same two dummy pads 110D. In some embodiments, the dummy routing 136D may include metal lines which extend from a dummy pad 110D which do not connect to another dummy pad 110D.

The dummy interconnect 136I may physically connect several dummy pads 110D together. The dummy interconnect 136I may also include an optional feature interconnect 136FI (which is also a type of dummy interconnect 136I) which couples one or more dummy pads 110D to one of the aforementioned features, such as the bulk metal 136B, metal comb 136C, or dummy routing 136D.

In FIG. 10, some dummy pads 110D and active pads 110A from the underlying metal layer 110 are illustrated in dashed outline to show the relation between the overlying features of the metal layer 136 and the dummy pads 110D and active pads 110A. The metal layer 136 may include corresponding pads, in some embodiments, which are aligned to the active pads 110A and the dummy pads 110D. Examples of corresponding pads are illustrated, for example, in FIGS. 18 through 20. As illustrated in FIG. 10, in some embodiments, dummy pads 110D may be interconnected to other dummy pads 110D by the dummy interconnect 136I. In such embodiments, these dummy pads 110D may optionally be connected to another heat dissipation feature by a feature interconnect 136FI.

FIG. 10 illustrates one each of a bulk metal 136B, a metal comb 136C, a metal mesh 136M, a dummy routing 136D, a dummy interconnect 136I, and a feature interconnect 136FI, however, it should be understood that the resulting package may utilize any combination of these features, including multiples thereof. Each of these may also be coupled to the underlying metal mesh 110M. As such, the dummy pads 110D may be coupled to the metal mesh 110M. For example, the dummy pad 110D may be coupled to a via 136V, which may be coupled to a dummy interconnect 136I and/or feature interconnect 136FI, which may be coupled to the bulk metal 136B, metal comb 136C, dummy routing 136D, and/or metal mesh 136M, which may be coupled to a via 136V, which may be coupled to the metal mesh 110M.

Accordingly, embodiments utilizing one of these heat dissipation features may have a heat dissipation path which radiates to the metal mesh 110M. Other embodiments may omit the use of a bulk metal 136B, a metal comb 136C, a metal mesh 136M, a dummy routing 136D, and a dummy interconnect 136I, in favor of using the wide metal 110W and pad bridges 110B, the wide metal 110W providing heat dissipation capabilities. Other embodiments may utilize both the wide metal 110W and one or more of the heat dissipation features of the metal layer 136. As such, a network of dummy structures is formed which results in a large thermal bulk which provide heat dissipation for a subsequent laser drilling process.

Figure 11:
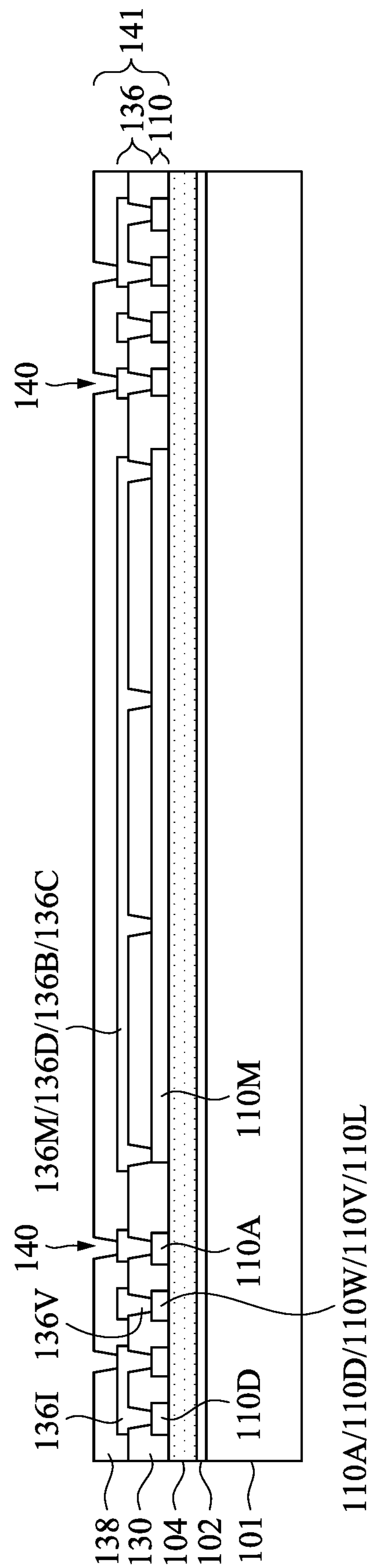

FIG. 11 illustrates the formation of dielectric layer 138. Openings 140 are formed in dielectric layer 138 to expose the underlying metal layer 136. The respective processes are illustrated as process 414 in the process flow 400 shown in FIG. 27. In accordance with some embodiments of the present disclosure, dielectric layer 138 is formed of a material selected from the same group of candidate materials for forming dielectric layers 130 and 104, and may include organic materials, as aforementioned. It is appreciated that although in the illustrated example embodiments, two dielectric layers 130 and 138, and the respective metal layers 110 and 136 are discussed as examples, fewer or more dielectric layers and conductive layers may be adopted, depending on the signal routing requirement. Throughout the description, metal layers 110 and 136 and dielectric layers 104, 130, and 138 are collectively referred to as backside interconnect structure 141, which is on the backside of the subsequently placed device die. The formation of dielectric layer 138 may include dispensing dielectric layer 138 in a flowable form, and then curing the flowable dielectric layer 138 to solidify it.

Figure 12:
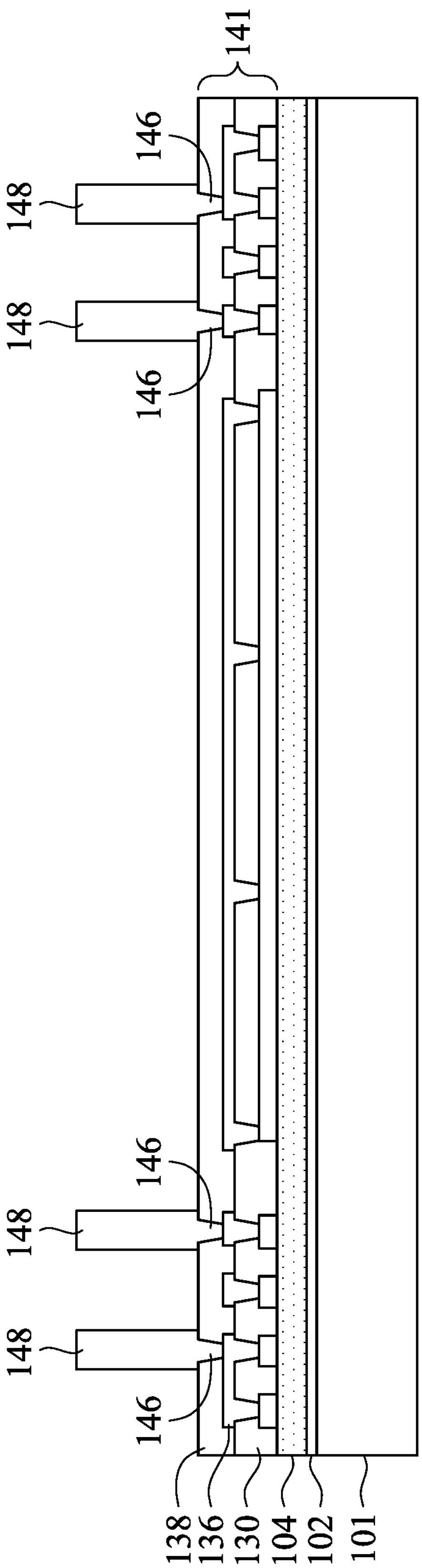

Referring to FIG. 12, vias 146 are formed in openings 140, and metal posts 148 are formed over and joined with vias 146. The respective process is illustrated as process 416 in the process flow 400 shown in FIG. 27. Vias 146 and metal posts 148 may be formed in common formation processes. In accordance with some embodiments, the formation processes include depositing a metal seed layer, forming a plating mask (not shown) over the metal seed layer, plating a metallic material in the openings in the plating mask, removing the plating mask, and etching the portions of the metal seed layer previously covered by the plating mask. In accordance with some embodiments of the present disclosure, the metal seed layer may include a titanium layer and a copper layer over the titanium layer. The formation of the metal seed layer may include PVD, CVD, or the like. The plating mask may include photo resist. The plated metallic material may include copper or a copper alloy, tungsten, or the like. The plated metallic material and the remaining portions of the metal seed layer thus form vias 146 and the metal posts 148.

Figure 13:
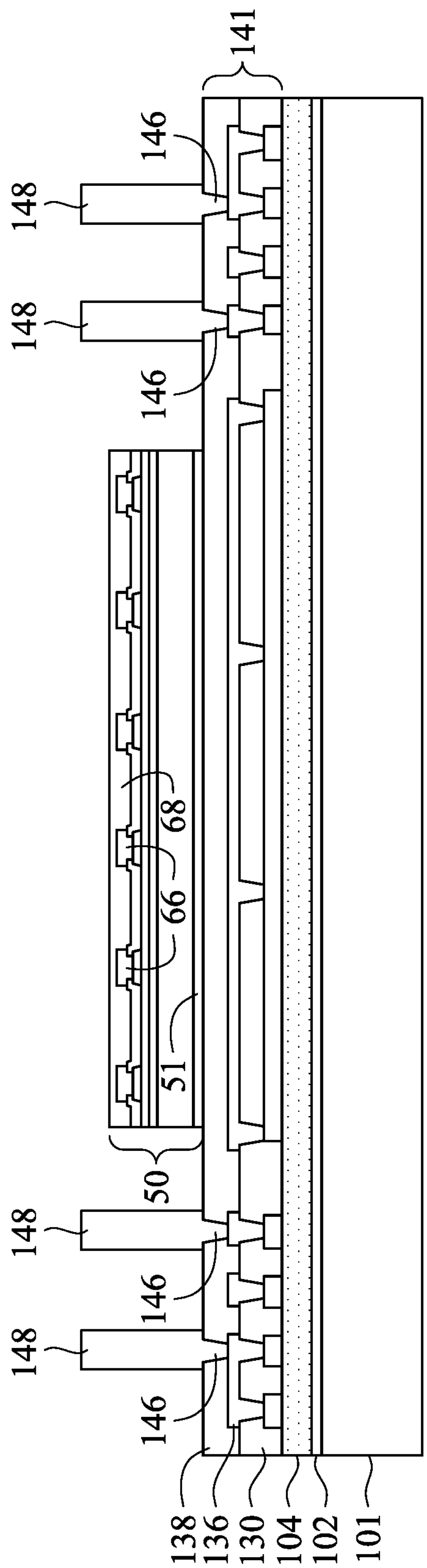

FIG. 13 illustrates the placement/attachment of circuit die 50 (see FIG. 1), with Die-Attach Film (DAF) 51 being used to adhere circuit die 50 to dielectric layer 138. The respective process is illustrated as process 418 in the process flow 400 shown in FIG. 27. Although one circuit die 50 is illustrated, there may be a plurality of package components being placed, which may be the same as each other or different from each other. In accordance with some embodiments, circuit die 50 is a device die, a package with a device die(s) packaged therein, a System-on-Chip (SoC) die including a plurality of integrated circuits (or device dies) integrated as a system, or the like. The device die in circuit die 50 may be or may include a logic die, a memory die, an input-output die, an Integrated Passive Device (IPD), or the like, or combinations thereof. For example, the logic die in circuit die 50 may be a Central Processing Unit (CPU) die, a Graphic Processing Unit (GPU) die, a mobile application die, a Micro Control Unit (MCU) die, a BaseBand (BB) die, an Application processor (AP) die, or the like. The memory die in circuit die 50 may include a Static Random Access Memory (SRAM) die, a Dynamic Random Access Memory (DRAM) die, or the like. Circuit die 50 may include dielectric layer 68 and die connectors 66 (such as metal pillars, micro-bumps, and/or bond pads) embedded in dielectric layer 68.

Figure 14:
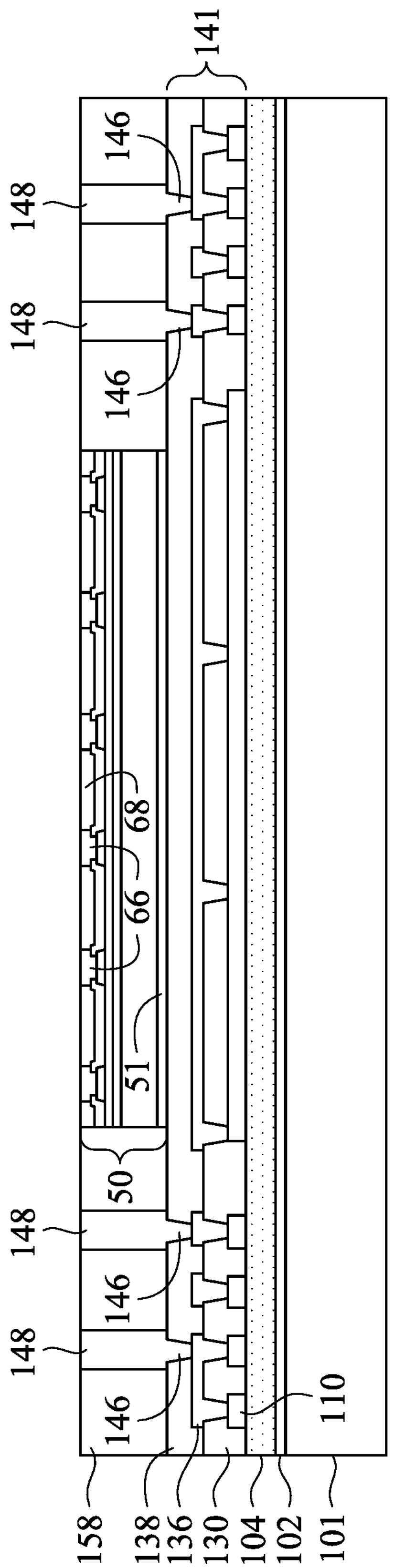

Next, as shown in FIG. 14, encapsulant 158 is dispensed to encapsulate circuit die 50 and metal posts 148 therein. The respective process is illustrated as process 420 in the process flow 400 shown in FIG. 27. Encapsulant 158 fills the gaps between neighboring metal posts 148 and circuit die 50. Encapsulant 158 may include a molding compound, a molding underfill, an epoxy, a resin, and/or the like. At the time of encapsulation, the top surface of encapsulant 158 is higher than the top ends of metal posts 148 and the top surface of circuit die 50. The molding compound or molding underfill (if used) may include a base material, which may be a polymer, a resin, an epoxy, or the like, and filler particles in the base material. The filler particles may be dielectric particles of silica, alumina, boron nitride, or the like, and may have spherical shapes. A planarization process such as a Chemical Mechanical Polish (CMP) process or a mechanical grinding process is then performed to thin encapsulant 158 and circuit die 50, until both of die connectors 66 and metal posts 148 are revealed. Due to the planarization process, the top ends of die connectors 66 and metal posts 148 are level (coplanar) with the top surfaces of encapsulant 158. Metal posts 148 are alternatively referred to as through-vias 148 hereinafter since they penetrate through encapsulant 158.

Figure 15:
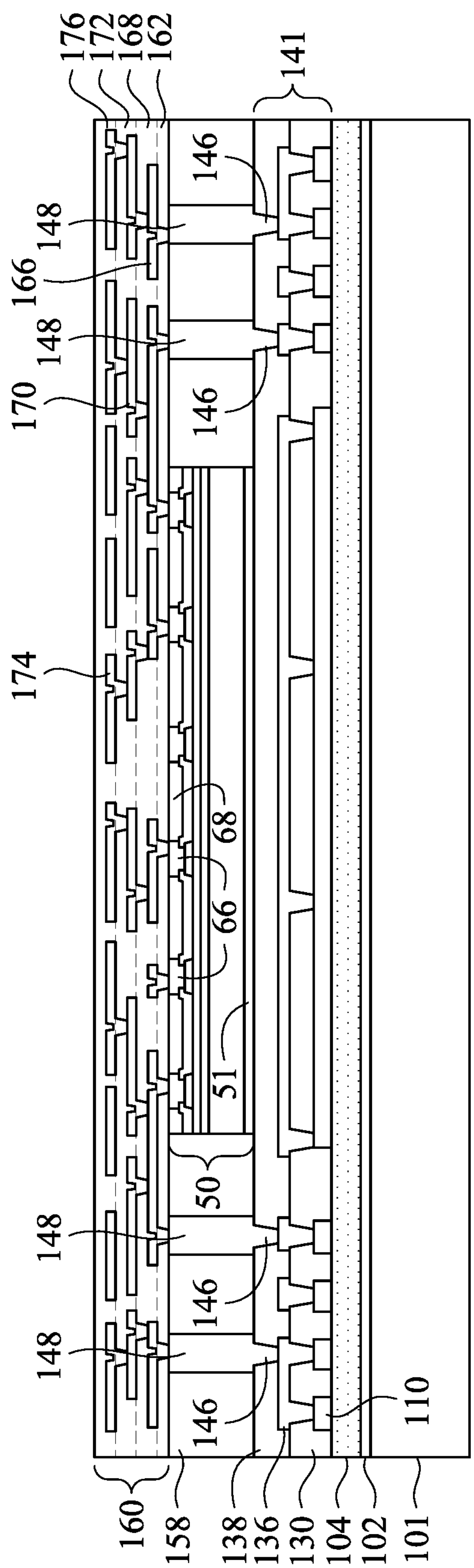
Figure 16:
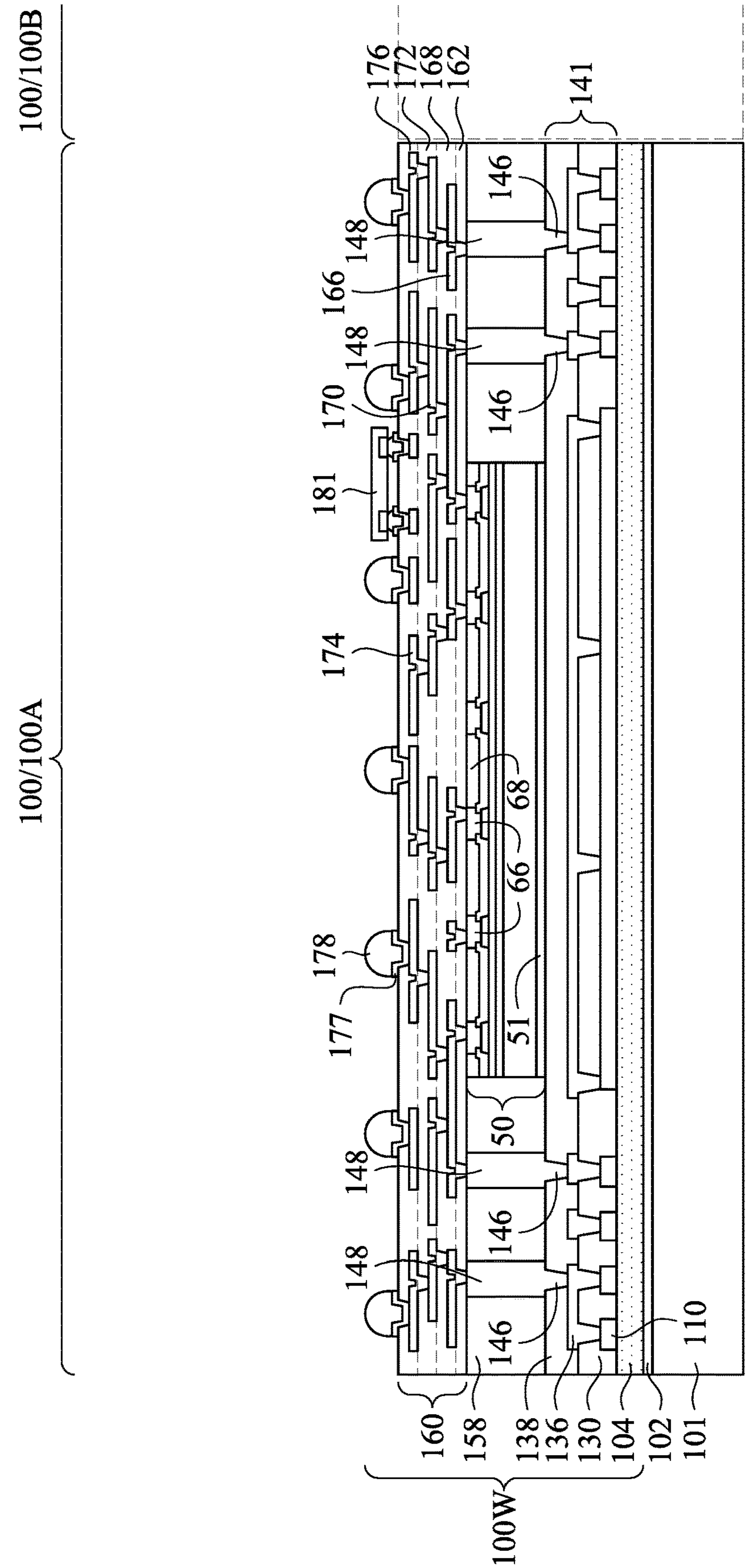
Figure 17:
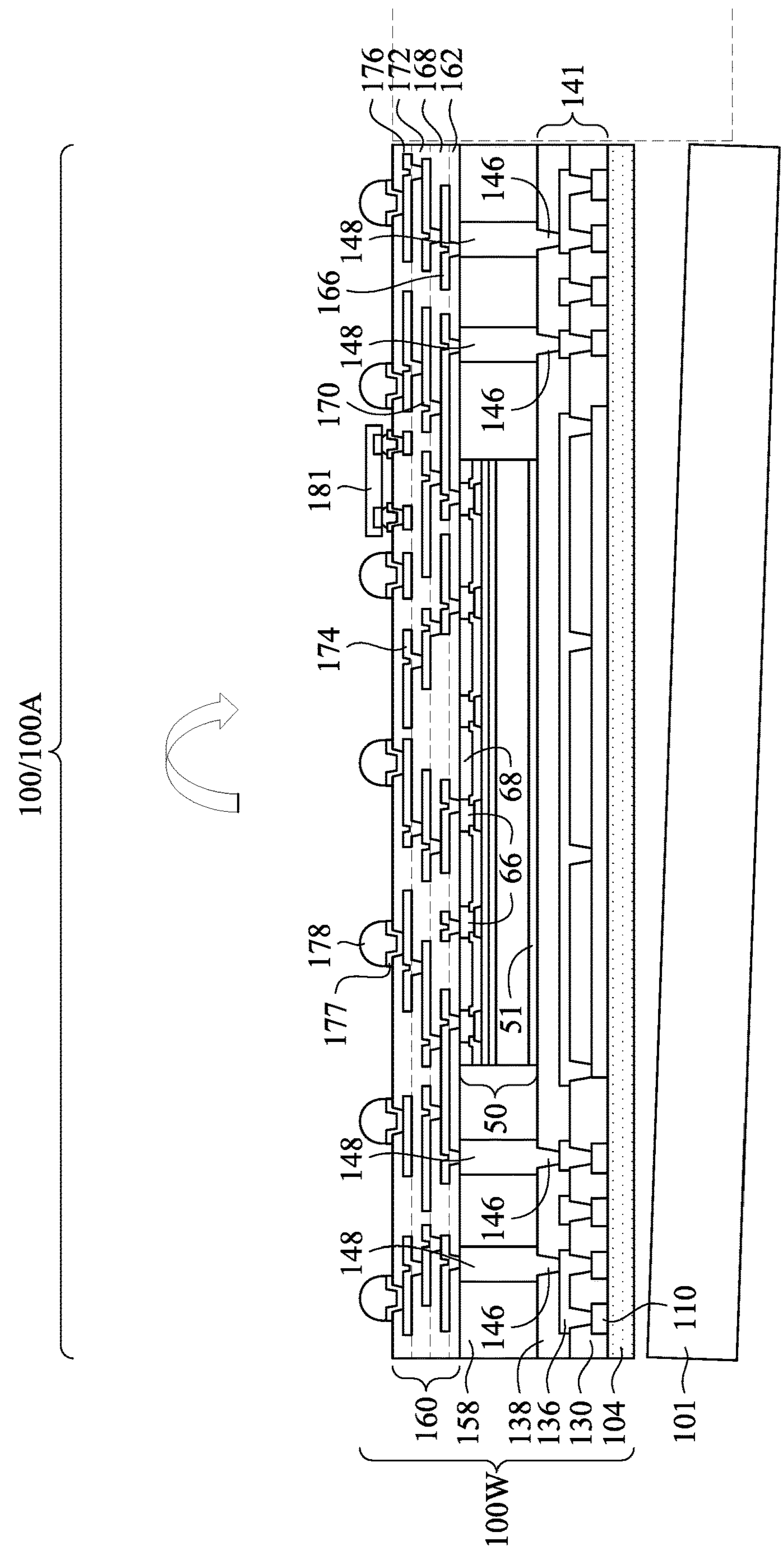

FIGS. 15 through 17 illustrate the formation of a front-side interconnect structure overlying and connecting to circuit die 50 and metal posts 148. The respective process is illustrated as process 422 in the process flow 400 shown in FIG. 27. Referring to FIG. 15, dielectric layer 162 is formed. In accordance with some embodiments of the present disclosure, dielectric layer 162 is formed of or comprises a polymer such as PBO, polyimide, BCB, or the like. The formation process includes coating dielectric layer 162 in a flowable form, and then curing dielectric layer 162. In accordance with alternative embodiments of the present disclosure, dielectric layer 162 is formed of an inorganic dielectric material such as silicon nitride, silicon oxide, or the like. The formation method may include CVD, Atomic Layer Deposition (ALD), Plasma-Enhanced Chemical Vapor Deposition (PECVD), or another applicable deposition method.

Openings (occupied by the via portions of RDLs 166) are then formed, for example, through a photo lithography process. Through-vias 148 and die connectors 66 are exposed through the openings. Next, RDLs 166 are formed. The formation process may be similar to the formation of metal layers 110 and 136. RDLs 166 are electrically connected to die connectors 66 and through-vias 148.

FIG. 15 further illustrates the formation of dielectric layers 168, 172, and 176, and RDLs 170 and 174. In accordance with some embodiments of the present disclosure, dielectric layers 168, 172, and 176 are formed of materials selected from the same or similar group of candidate materials for forming dielectric layers 130 and 138, and may include organic materials or inorganic materials. Throughout the description, RDLs 166, 170 and 174 and dielectric layers 162, 168, 172, and 176 are collectively referred to as front-side interconnect structure 160.

FIG. 16 illustrates the formation of Under-Bump Metallurgies (UBMs) 177 and conductive connectors 178 in accordance with some embodiments. The respective processes are illustrated as process 424 in the process flow 400 shown in FIG. 27. To form UBMs 177, openings are formed in dielectric layer 176 to expose the underlying metal pads, which are parts of RDLs 174 in the illustrative embodiments. UBMs 177 may be formed of nickel, copper, titanium, or multi-layers thereof. UBMs 177 may include a titanium layer and a copper layer over the titanium layer.

Conductive connectors 178 are then formed on UBMs 177. The conductive connectors 178 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 178 may include a conductive material such as solder, copper, aluminum, gold, nickel, silver, palladium, tin, the like, or a combination thereof. In some embodiments, the conductive connectors 178 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 178 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In accordance with some embodiments of the present disclosure, optional Independent Passive Device (IPD) 181 may be bonded to the front-side interconnect structure 160 through some of conductive connectors 178. The respective process is illustrated as process 426 in the process flow 400 shown in FIG. 27. IPD 181 may be or may comprise a passive device such as a capacitor die, an inductor die, a resistor die, or the like, or may include the combinations of the passive devices.

Accordingly, the reconstructed wafer 100W is formed. The reconstructed wafer 100W may include several package regions, such as the first package region 100A and the second package region 100B (illustrated by the dashed lines).

Next, in FIG. 17, the reconstructed wafer 100W is de-bonded from carrier 101. The respective process is illustrated as process 428 in the process flow 400 shown in FIG. 27. In accordance with some embodiments, a light beam (which may be a laser beam) is projected on release film 102, and the light beam penetrates through the transparent carrier 101. Release film 102 is thus decomposed. Carrier 101 may be lifted off from release film 102, and hence reconstructed wafer 100W is de-bonded (demounted) from carrier 101. The reconstructed wafer 100W is then flipped over and placed on a tape (not shown).

Figure 18:
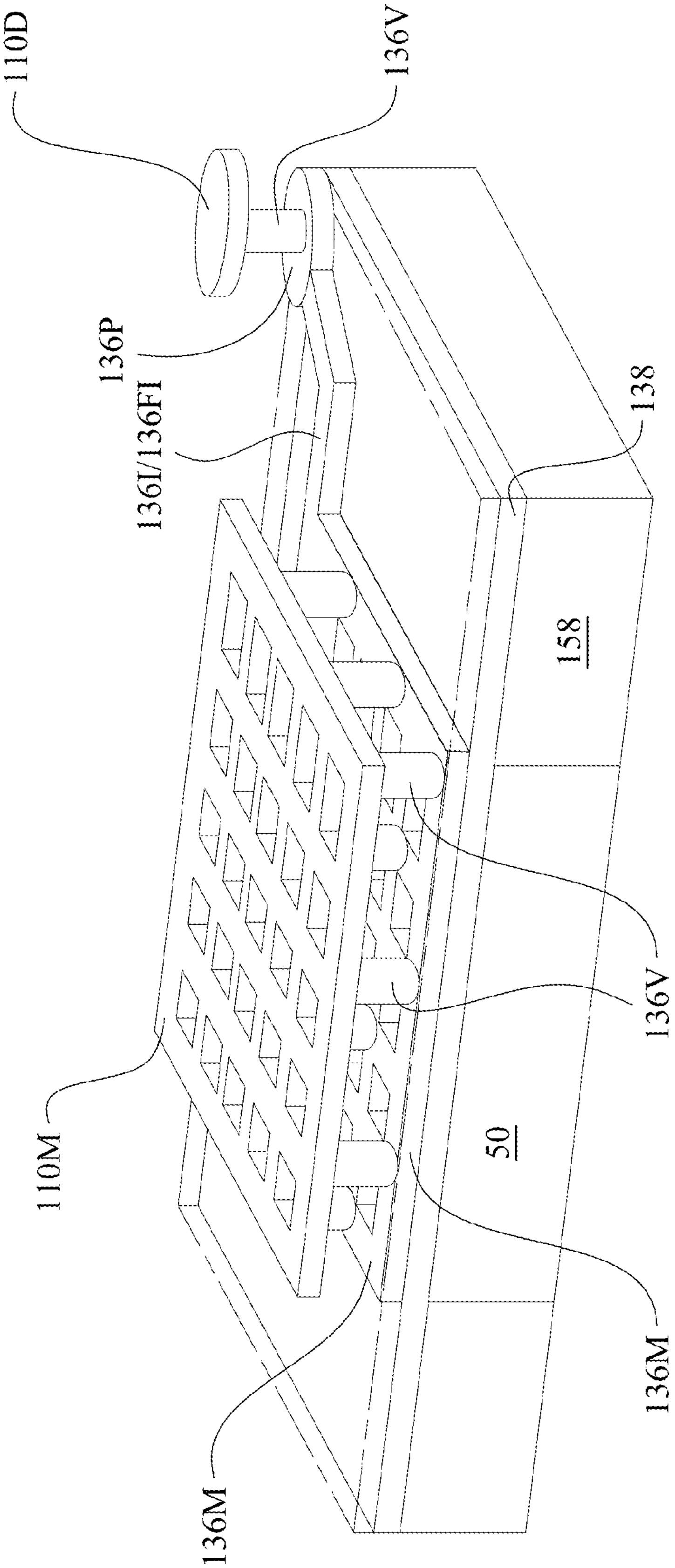
FIGS. 18 and 19 illustrate perspective views and FIG. 20 illustrates a perspective view and a top down (or plan) view of devices which are consistent with that illustrated in FIG. 17, in accordance with some embodiments.
Figure 19:
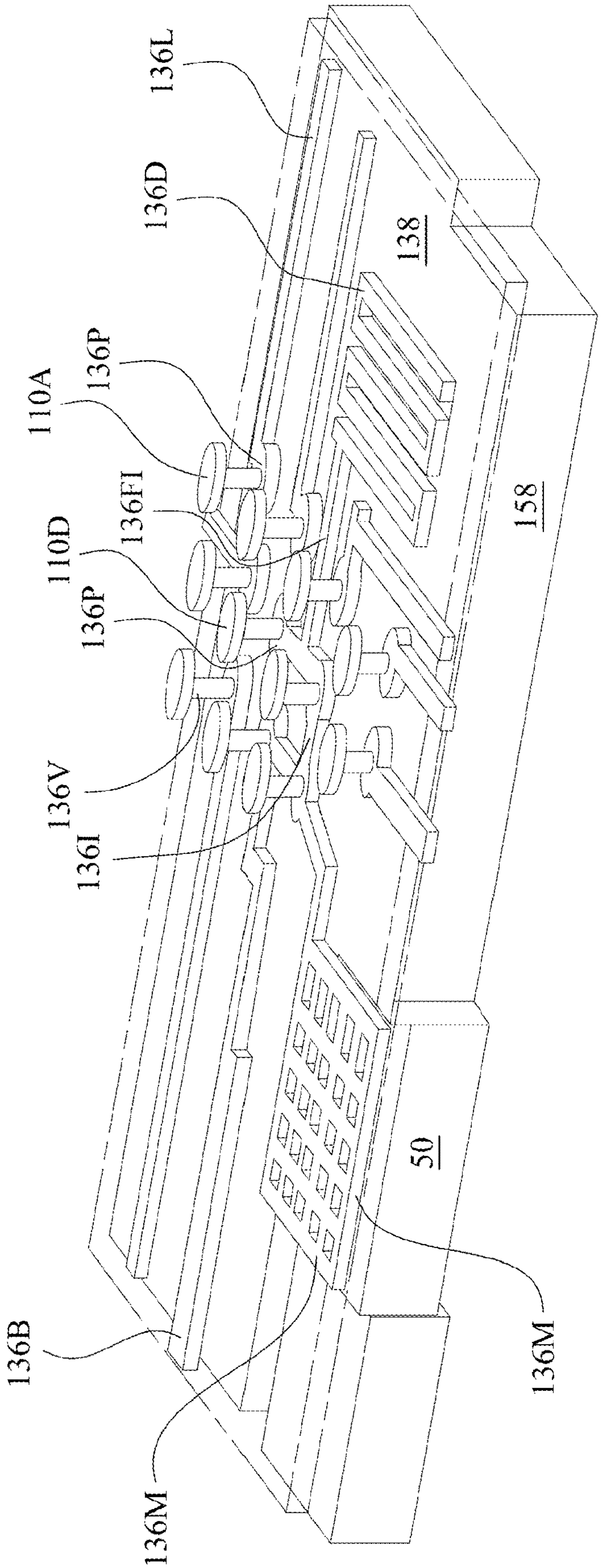
Figure 20:
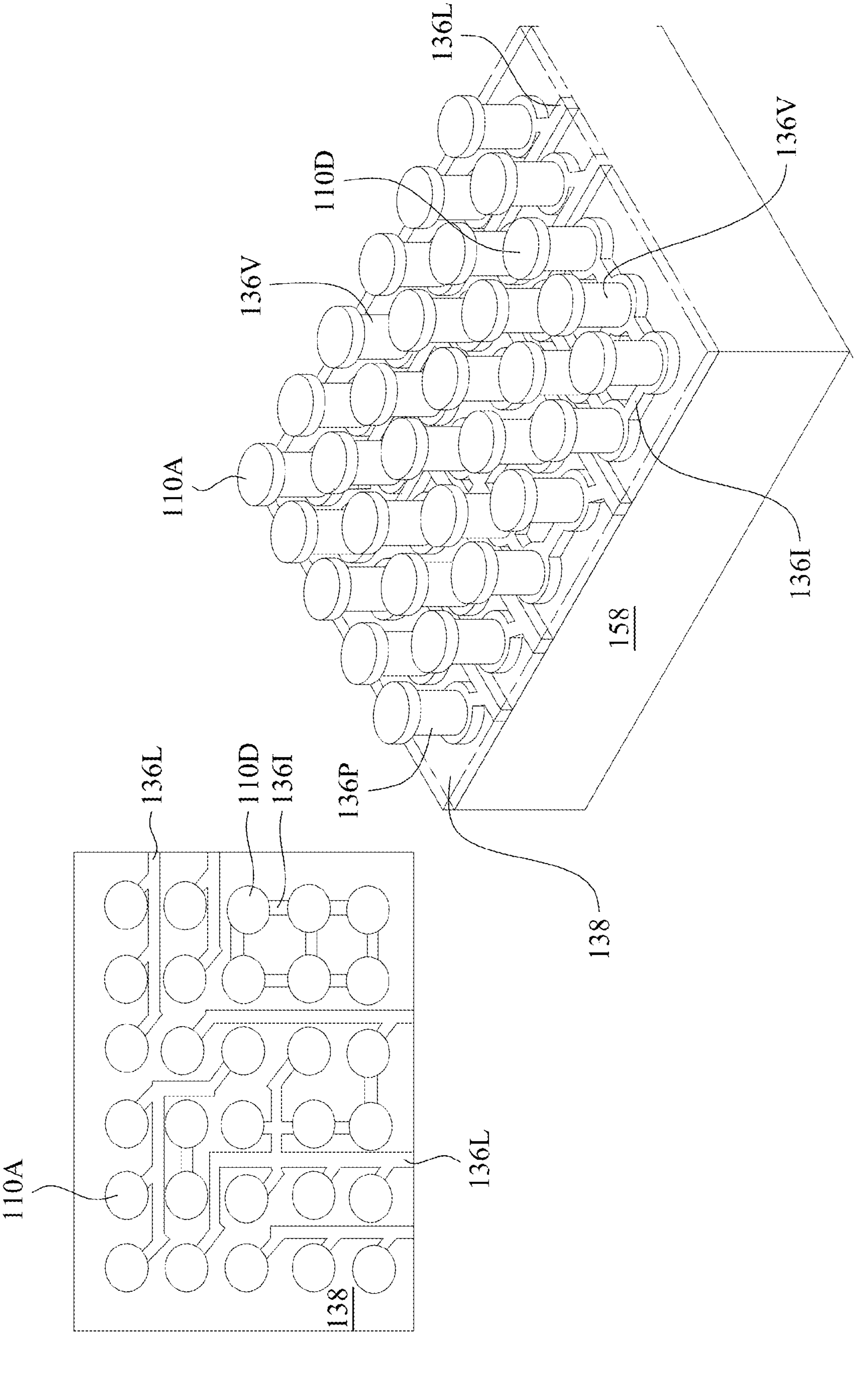

FIGS. 18 and 19 illustrate perspective views and FIG. 20 illustrates a perspective view and a top down (or plan) view of devices which are consistent with that illustrated in FIG. 17. Some features have been omitted to aid in clarity, for example, the dielectric layer 130 has been omitted and the dielectric layer 138 altered to make the metal layer 110 and the metal layer 136 visible. Notably, these devices are not direct representations of that depicted in FIG. 17, but are consistent with such, and may be formed using the above-described processes and materials. Like elements have been labeled with like references. FIGS. 18 through 20 also illustrate that the metal layer 136 may also include corresponding pad areas 136P, which correspond to the active pads 110A or dummy pads 110D.

FIG. 18 illustrates a portion of a device that includes a circuit die 50 surrounded by an encapsulant 158. A portion of the dielectric layer 138 is illustrated as well. The metal layer 110 includes a metal mesh 110M and a dummy pads 110D. The dummy pad 110D is coupled to the metal mesh 110M by way of the metal layer 136. In particular, a metal via 136V couples the dummy pad 110D to a dummy interconnect 136I or feature interconnect 136FI to a metal mesh 136M. Then, the metal mesh 136M is coupled to the metal mesh 110M by vias 136V. When a laser drilling process is used to expose the dummy pad 110D, as described below with respect to FIG. 22, heat paths are provided to dissipate heat through the via 136V, through the dummy interconnect 136I (or feature interconnect 136FI), to the metal mesh 136M, back up through the vias 136V, and to the metal mesh 110M.

FIG. 19 illustrates a portion of a device that includes a circuit die 50 surrounded by an encapsulant 158. A portion of the dielectric layer 138 is also illustrated. The metal layer 110 includes dummy pads 110D and active pads 110A. The active pads 110A are coupled by vias 136V to redistribution lines 136L which are routed to other electrical features, such as other conductors, signal lines, power lines, ground lines, etc. The dummy pads 110D are coupled by vias 136V to the dummy interconnect 136I. The dummy interconnect 136I is then coupled to the dummy routing 136D by the feature interconnect 136FI. The dummy interconnect is also coupled to the metal mesh 136M by a feature interconnect 136FI and coupled to the bulk metal 136B by another feature interconnect 136FI. When a laser drilling process is used to expose the dummy pads 110D, as described below with respect to FIG. 22, heat paths are provided to dissipate heat through the vias 136V, through the dummy interconnect 136I, and through the feature interconnects 136FI) to the metal mesh 136M, bulk metal 136B, and/or dummy routing 136D.

FIG. 20 provides a perspective view and a top down view of a portion of a device, including an encapsulant 158 and dielectric layer 138 over the encapsulant 158. Active pads 110A are coupled to redistribution lines 136L by way of the vias 136V. The redistribution lines 136L may be routed in the dielectric layer 138 to couple together certain active pads 110A or routed to other electrical features, such as other conductors, signal lines, power lines, ground lines, etc. The dummy pads 110D are coupled by vias 136V to the dummy interconnect 136I. As noted above, the dummy interconnect 136I may then be coupled to other metal features in the metal layer 136, such as dummy routing 136D, bulk metal 136B, metal comb 136C, and/or metal mesh 136M. In FIG. 20, however, the dummy interconnect 136I couples together several dummy pads 110D. When a laser drilling process is used to expose the dummy pads 110D, as described below with respect to FIG. 22, heat paths are provided to dissipate heat through the vias 136V, through the dummy interconnect 136I, through the other vias 136V coupled to the dummy interconnect 136I, and through the other dummy pads 110D.

Figure 21:
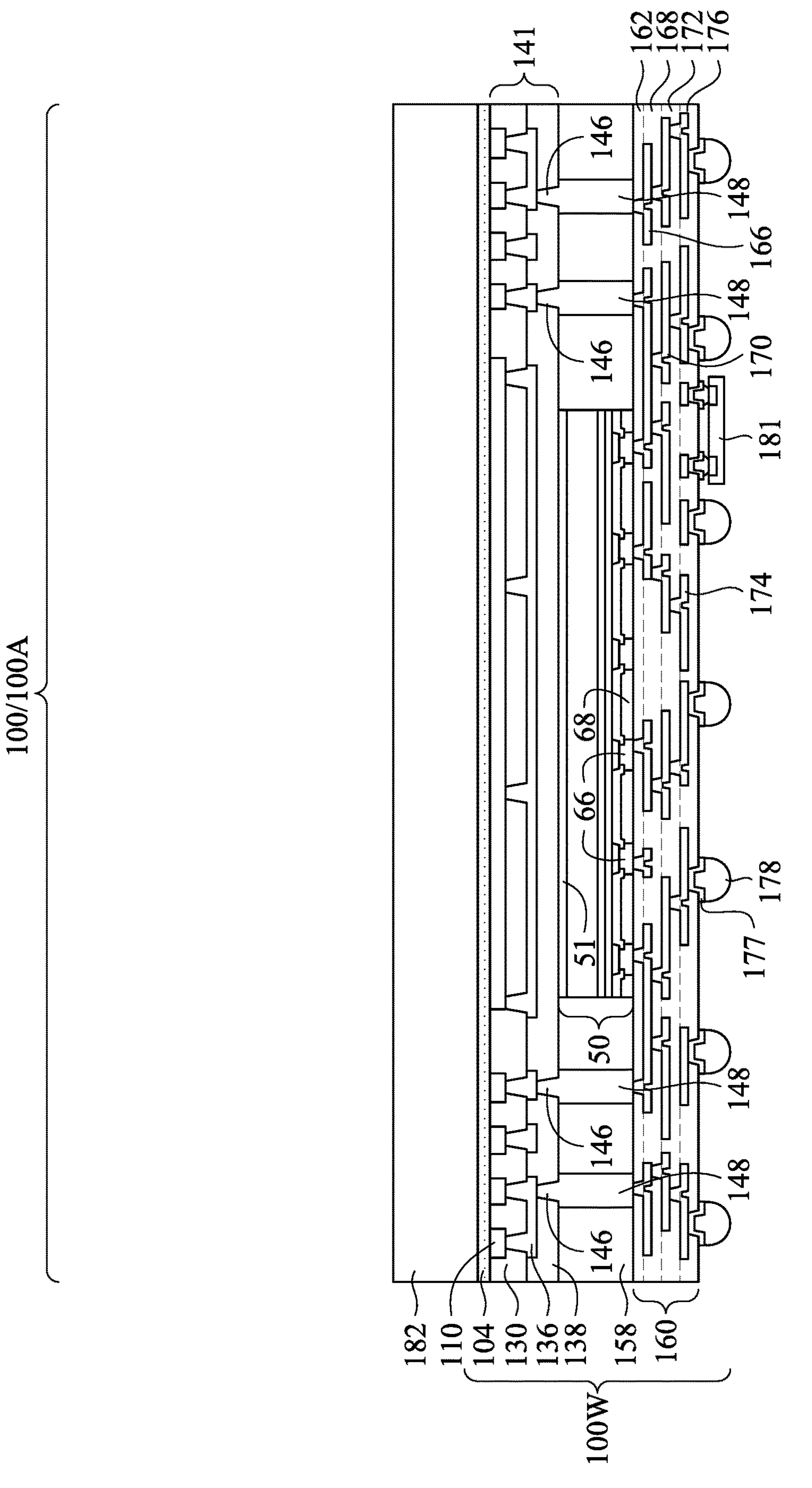

In FIG. 21, a backside dielectric layer 182 is attached to the dielectric layer 104. The respective process is illustrated as process 430 in the process flow 400 shown in FIG. 27. The backside dielectric layer 182 provides warpage control and protection of the backside interconnect structure 141 when mounting another device over the backside of the reconstructed wafer 100W. The thickness of the backside dielectric layer 182 may be between about 30 μm and 150 μm thick, although other thicknesses may be used. The backside dielectric layer 182 may be formed of any suitable material. In some embodiments, the backside dielectric layer 182 is made of an inorganic filler, such as silicon oxide, and epoxy resin. In some embodiments, the composition of the backside dielectric layer 182 may include a filler at 10-90% by weight, resin at 10-90% by weight, a coupling agent at 0.5-1% by weight, a stress release agent at 0.5-5% by weight, an adhesion promoter at 0.5-1% by weight, a catalyst at 0.3-0.7% by weight, and a colorant at 0.5-1% by weight. Other suitable materials include any polymer dry film which is able to be drilled by laser. The backside dielectric layer 182 stabilizes and controls warpage by inducing an inward horizontal compression force toward the backside of the reconstructed wafer 100W. For example, the co-efficient of thermal expansion (CTE) for the reconstructed wafer 100W may be between about 12 ppm and 20 ppm, such as about 16 ppm, while the CTE for the backside dielectric layer 182 is greater than the CTE of the reconstructed wafer 100W, for example, greater than about 16-20 ppm to about 30 ppm, such as about 22 ppm. The backside dielectric layer 182 may be attached to the dielectric layer 104 by a thermal lamination process, so that when the backside dielectric layer 182 cools after attaching, the compressive counter force is generated by the backside dielectric layer 182 to control warpage of the reconstructed wafer 100W.

Figure 22:
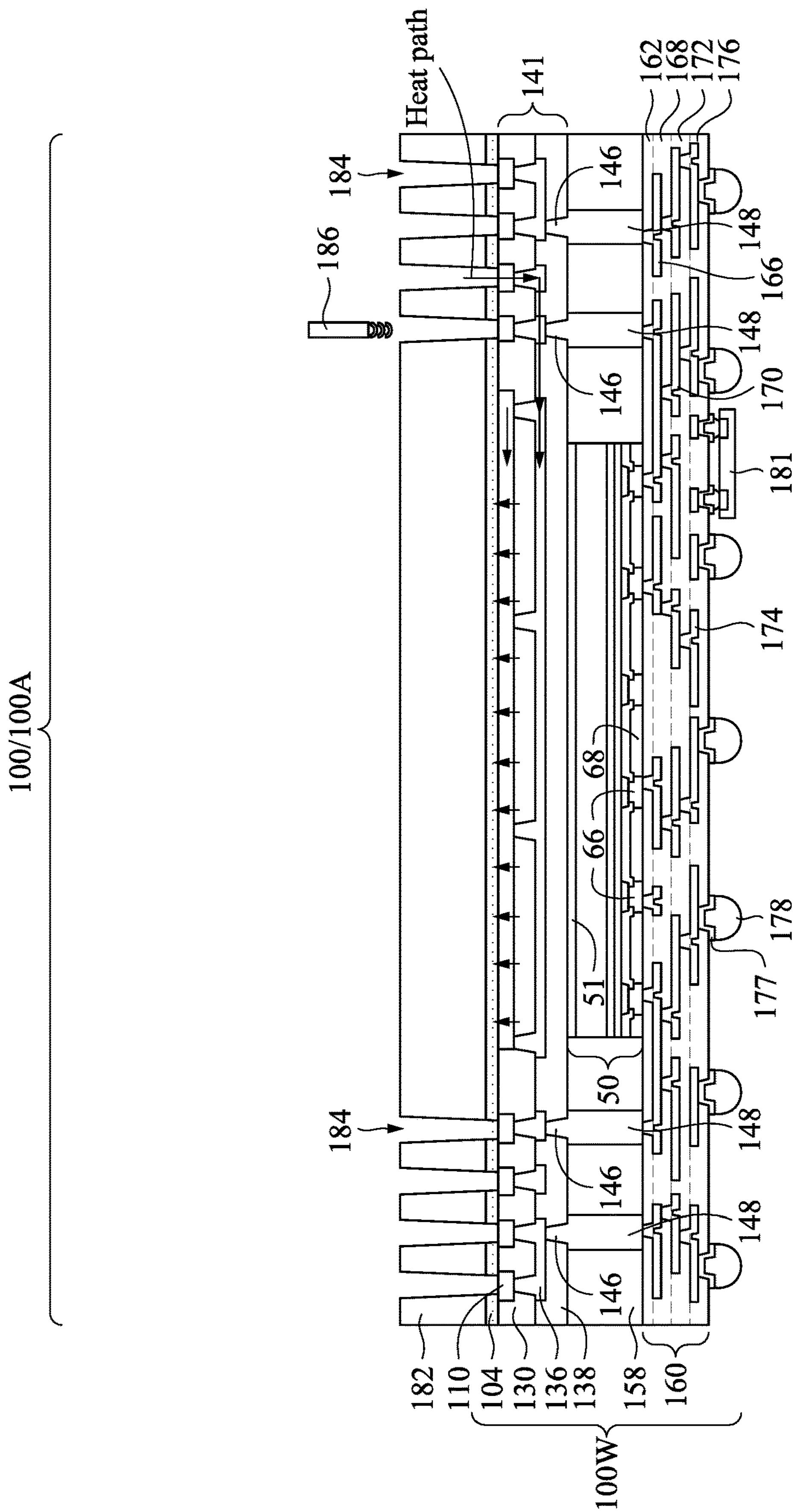

In FIG. 22, openings 184 are formed to expose features (e.g., active pads 110A and/or dummy pads 110D) of the metal layer 110. The respective process is illustrated as process 432 in the process flow 400 shown in FIG. 27. The openings 184 may be formed by any suitable process. In one embodiment, due in part to the thickness of the backside dielectric layer 182, a laser drilling process 186 is used to expose features of the metal layer 110 through the openings 184. As the laser is energized, the material of the backside dielectric layer 182 is vaporized in a downward direction, removing material of the backside dielectric layer 182 until the laser reaches the dielectric layer 104. Then the material of the dielectric layer 104 is removed until the features of the metal layer 110 are exposed. One side-effect of the laser drilling process is that the surrounding material becomes heated. When the laser begins to heat the metal layer 110, a risk of delamination between the metal layer and the dielectric layer 104 may occur due to overheating the feature (e.g., active pad 110A or dummy pad 110D) of the metal layer 110 being exposed. The delamination reduces reliability of the device by causing the risk of device failure. Active pads 110A which are exposed by the laser drilling process may be routed by vias (e.g., vias 136V) to a redistribution structure, e.g., backside interconnect structure 141, which may help disperse heat from the laser drilling process through the metallization routings of the redistribution structure. Because embodiment dummy pads 110D may also be attached to other metal features of the metal layer 110 and/or metal layer 136, the heat generated by exposing the dummy pads 110D may also be routed to other metal features and away from the dummy pads 110D, thereby reducing and/or eliminating the risk of delamination from overheating.

In some embodiments, heat from the laser drilling process 186 may travel, for example, from the dummy pads 110D across the pad bridges 110B and to the wide metal 110W (see FIG. 7), which provides a large bulk of metal material and a large interface to the surrounding dielectric layers. In some embodiments, heat from the laser drilling process 186 may travel by vias 136V to the metal layer 136, which may radiate to the dummy interconnect 136I, metal mesh 136M, dummy routing 136D, and/or bulk metal 136B (see FIG. 10) by way of a feature interconnect 136FI. In some embodiments, the heat may also be radiated back up to the metal layer 110 from the metal layer 136 by vias 136V, for example to the metal mesh 110M (such as illustrated in FIGS. 18 and 22).

Figure 23:
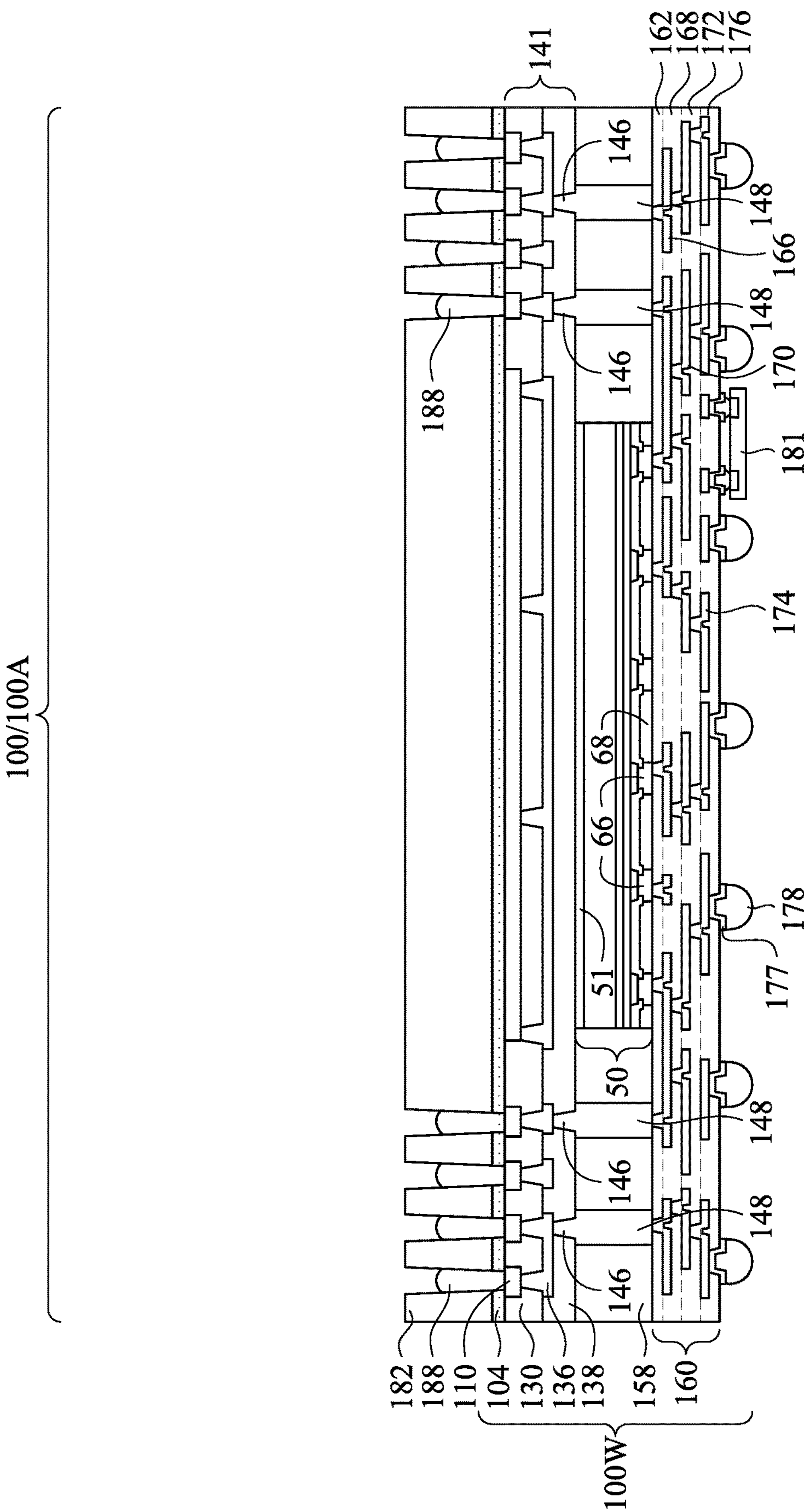

In FIG. 23, a solder-containing layer 188, which may be a solder layer (sometimes known as a pre-solder layer), a silver paste, a solder paste, or the like, is formed on each of the exposed portions of the metal layer 110 (e.g., dummy pads 110D and active pads 110A) in the openings 184. The respective process is illustrated as process 434 in the process flow 400 shown in FIG. 27. The process used to form the solder-containing layer 188 may be a solder printing or solder stenciling process. In some embodiments, the solder-containing layer 188 may completely fill or overfill the openings 184, while, in other embodiments, the solder-containing layer 188 may only partially fill the openings 184. After the solder-containing layer 188 is deposited, a reflow process may be performed before bonding the conductive connectors 190 to the solder-containing layer 188 (see, e.g., FIG. 25). In some embodiments, the solder-containing layer 188 can be omitted.

Figure 24:
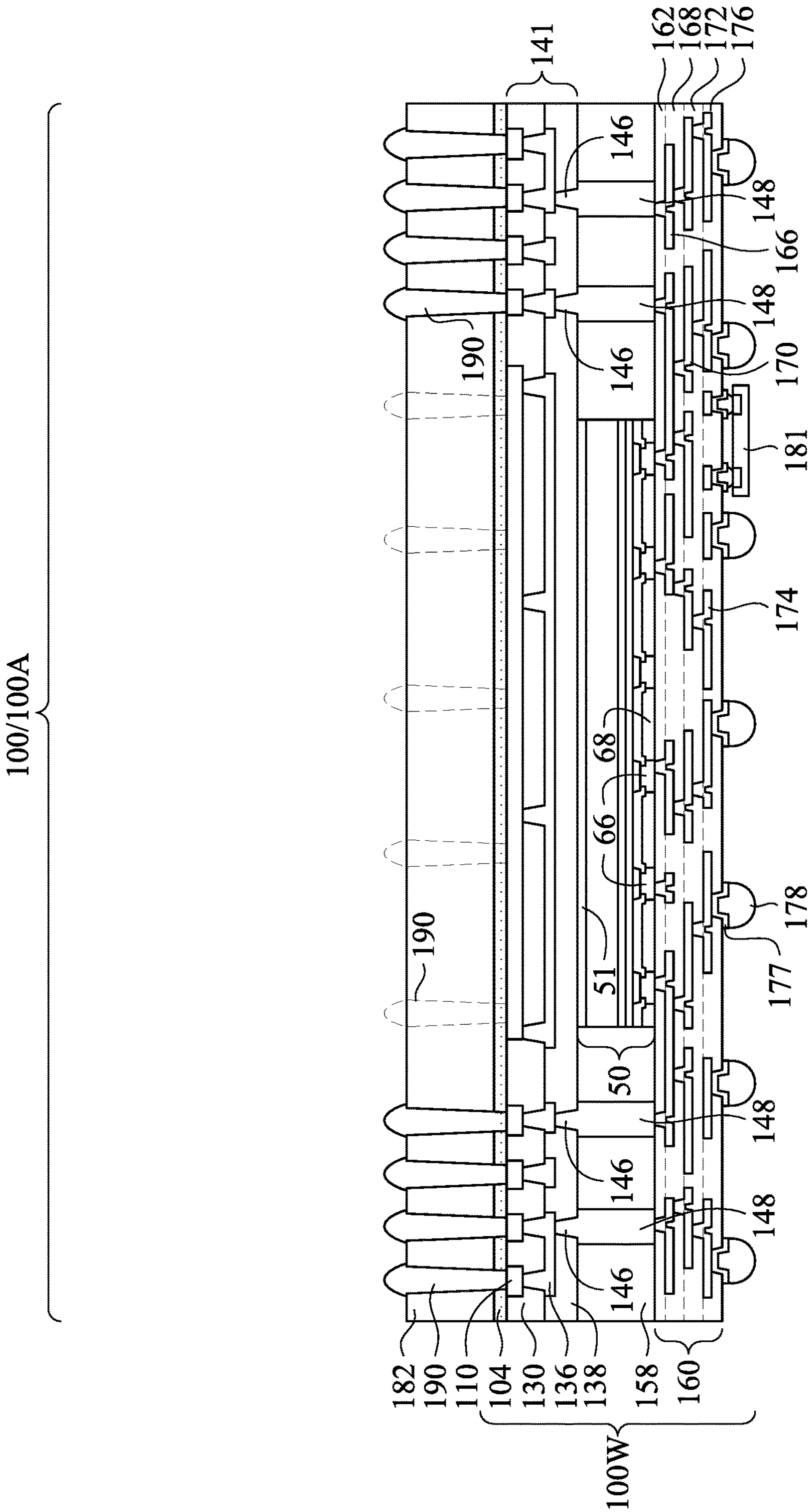

In FIG. 24, the conductive connectors 190 are formed by depositing an additional solder material in the remainder of the openings 184 and reflowing the solder-containing layer 188 and additional solder material to bond the additional solder material to the solder-containing layer 188, thereby forming the conductive connectors 190. The respective process is also illustrated as process 434 in the process flow 400 shown in FIG. 27. The additional solder material may be deposited by a printing process, a stenciling process, a ball-drop process, or the like. After the reflow process to bond the additional solder material to the solder-containing layer 188, the solder-containing layer 188 and the additional solder material may intermix and not be distinctly visible as separate structures as shown in FIG. 24. In some embodiments, the conductive connectors 190 are formed in a manner similar to the conductive connectors 178, and may be formed of a similar material as the conductive connectors 178. FIG. 24 also illustrates optional conductive connectors 190 in a dashed outline which may provide connectors which land on the metal mesh 110M.

Figure 25:
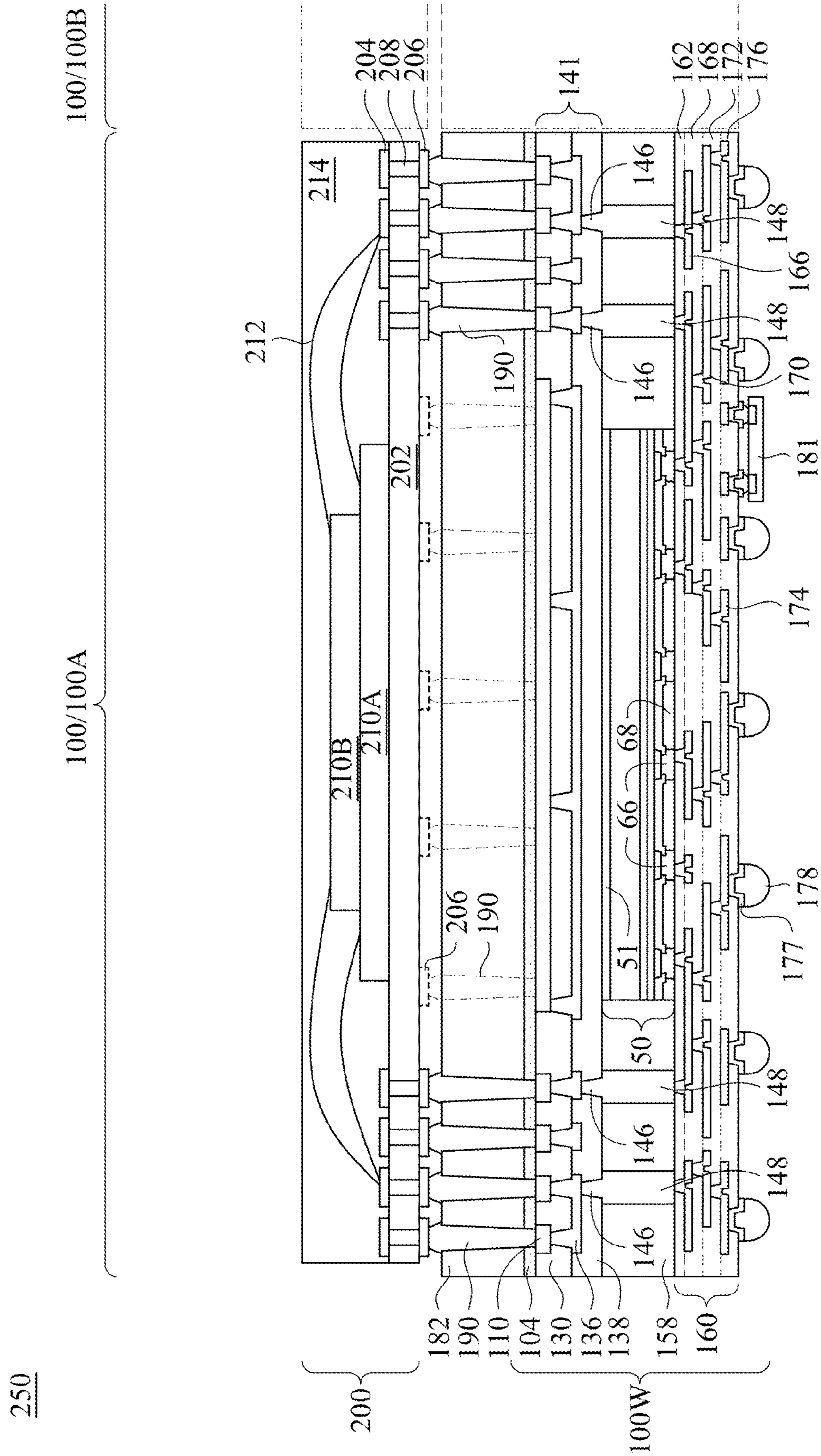

FIG. 25 illustrates the formation and implementation of device stacks, in accordance with some embodiments. The device stacks are formed from the package regions of the reconstructed wafer 100W, each package region corresponding to a package component of the device stacks. The device stacks may also be referred to as package-on-package (POP) structures.

In FIG. 25, second package components 200 are coupled to the reconstructed wafer 100W. The respective process is illustrated as process 436 in the process flow 400 shown in FIG. 27. One of the second package components 200 is coupled in each of the package regions 100A and 100B to a corresponding package component to form an integrated circuit device stack in each region of the reconstructed wafer 100W. For example, the second package components 200 are attached to the first package component 100.

The second package components 200 include, for example, a substrate 202 and one or more stacked dies (e.g., 210A and 210B) coupled to the substrate 202. Although one set of stacked dies 210A and 210B is illustrated, in other embodiments, a plurality of stacked dies 210A and 210B (each having one or more stacked dies) may be disposed side-by-side coupled to a same surface of the substrate 202. The substrate 202 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 202 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 202 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for the substrate 202.

The substrate 202 may include active and passive devices (not shown). A wide variety of devices such as transistors, capacitors, resistors, combinations of these, and the like may be used to generate the structural and functional requirements of the design for the second package components 200. The devices may be formed using any suitable methods.

The substrate 202 may also include metallization layers (not shown) and the conductive vias 208. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate 202 is substantially free of active and passive devices.

The substrate 202 may have bond pads 204 on a first side of the substrate 202 to couple to the stacked dies 210A and 210B, and bond pads 206 on a second side of the substrate 202, the second side being opposite the first side of the substrate 202, to couple to the conductive connectors 190. In some embodiments, the bond pads 204 and 206 are formed by forming recesses (not shown) into dielectric layers (not shown) on the first and second sides of the substrate 202. The recesses may be formed to allow the bond pads 204 and 206 to be embedded into the dielectric layers. In other embodiments, the recesses are omitted as the bond pads 204 and 206 may be formed on the dielectric layer. In some embodiments, the bond pads 204 and 206 include a thin seed layer (not shown) made of copper, titanium, nickel, gold, palladium, the like, or a combination thereof. The conductive material of the bond pads 204 and 206 may be deposited over the thin seed layer. The conductive material may be formed by an electro-chemical plating process, an electroless plating process, CVD, atomic layer deposition (ALD), PVD, the like, or a combination thereof. In an embodiment, the conductive material of the bond pads 204 and 206 is copper, tungsten, aluminum, silver, gold, the like, or a combination thereof.

In some embodiments, the bond pads 204 and the bond pads 206 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 204 and 206. Any suitable materials or layers of material that may be used for the bond pads 204 and 206 are fully intended to be included within the scope of the current application. In some embodiments, the conductive vias 208 extend through the substrate 202 and couple at least one of the bond pads 204 to at least one of the bond pads 206.

In the illustrated embodiment, the stacked dies 210A and 210B are coupled to the substrate 202 by wire bonds 212, although other connections may be used, such as conductive bumps. In an embodiment, the stacked dies 210A and 210B are stacked memory dies. For example, the stacked dies 210A and 210B may be memory dies such as low-power (LP) double data rate (DDR) memory modules, such as LPDDR1, LPDDR2, LPDDR3, LPDDR4, or the like memory modules.

The stacked dies 210A and 210B and the wire bonds 212 may be encapsulated by a molding material 214. The molding material 214 may be molded on the stacked dies 210A and 210B and the wire bonds 212, for example, using compression molding. In some embodiments, the molding material 214 is a molding compound, a polymer, an epoxy, silicon oxide filler material, the like, or a combination thereof. A curing process may be performed to cure the molding material 214; the curing process may be a thermal curing, a UV curing, the like, or a combination thereof.

In some embodiments, the stacked dies 210A and 210B and the wire bonds 212 are buried in the molding material 214, and after the curing of the molding material 214, a planarization step, such as a grinding, is performed to remove excess portions of the molding material 214 and provide a substantially planar surface for the second package components 200.

After the second package components 200 are formed, the second package components 200 are mechanically and electrically bonded to the first package components 100 of the reconstructed wafer 100W by way of the conductive connectors 190, the bond pads 206, and the metal layer 110 (e.g., active pads 110A and dummy pads 110D). In some embodiments, the stacked dies 210A and 210B may be coupled to the integrated circuit dies 50 through the wire bonds 212, the bond pads 204 and 206, the conductive vias 208, the conductive connectors 190, the backside interconnect structure 141, the through-vias 148, and the front-side interconnect structure 160. FIG. 25 also illustrates optional conductive connectors 190 in a dashed outline and corresponding bond pads 206, which may provide connectors between the second package components 200 and first package component 100 which land on the metal mesh 110M.

In some embodiments, a solder resist (not shown) is formed on the side of the substrate 202 opposing the stacked dies 210A and 210B. The conductive connectors 190 may be disposed in openings in the solder resist to be electrically and mechanically coupled to conductive features (e.g., the bond pads 206) in the substrate 202. The solder resist may be used to protect areas of the substrate 202 from external damage.

In some embodiments, the conductive connectors 190 have an epoxy flux (not shown) formed thereon before they are reflowed with at least some of the epoxy portion of the epoxy flux remaining after the second package components 200 are attached to the first package components 100.

In some embodiments, an underfill (not shown) is formed between the first package component 100 and the second package components 200, surrounding the conductive connectors 190. The underfill may reduce stress and protect the joints resulting from the reflowing of the conductive connectors 190. The underfill may be formed by a capillary flow process after the second package components 200 are attached, or may be formed by a suitable deposition method before the second package components 200 are attached. In embodiments where the epoxy flux is formed, it may act as the underfill.

FIG. 25 illustrates the second package region 100B with dashed lines, the second package region 100B being adjacent to the first package region 100A of the reconstructed wafer 100W with dashed lines. FIG. 25 also shows the resulting singulated device stack 250 following a singulation process. The respective process is illustrated as process 438 in the process flow 400 shown in FIG. 27. The singulation process is performed by sawing along scribe line regions, e.g., between the first package region 100A and the second package region 100B, resulting in a first package component 100 from the first package region 100A. The sawing singulates the first package region 100A from the second package region 100B. The resulting, singulated device stack 250 is from one of the first package region 100A or the second package region 100B. For example, the singulated device stack 250 may include the first package component 100 and second package components 200 attached to the first package component, resulting in the singulated device stack 250. In some embodiments, the singulation process is performed after the second package components 200 are coupled to the first package component 100 (e.g., in the package region 100A). In other embodiments (not shown), the singulation process is performed before the second package components 200 are coupled to the first package component 100, such as after the carrier 101 is de-bonded and the conductive connectors 190 are formed.

Figure 26:
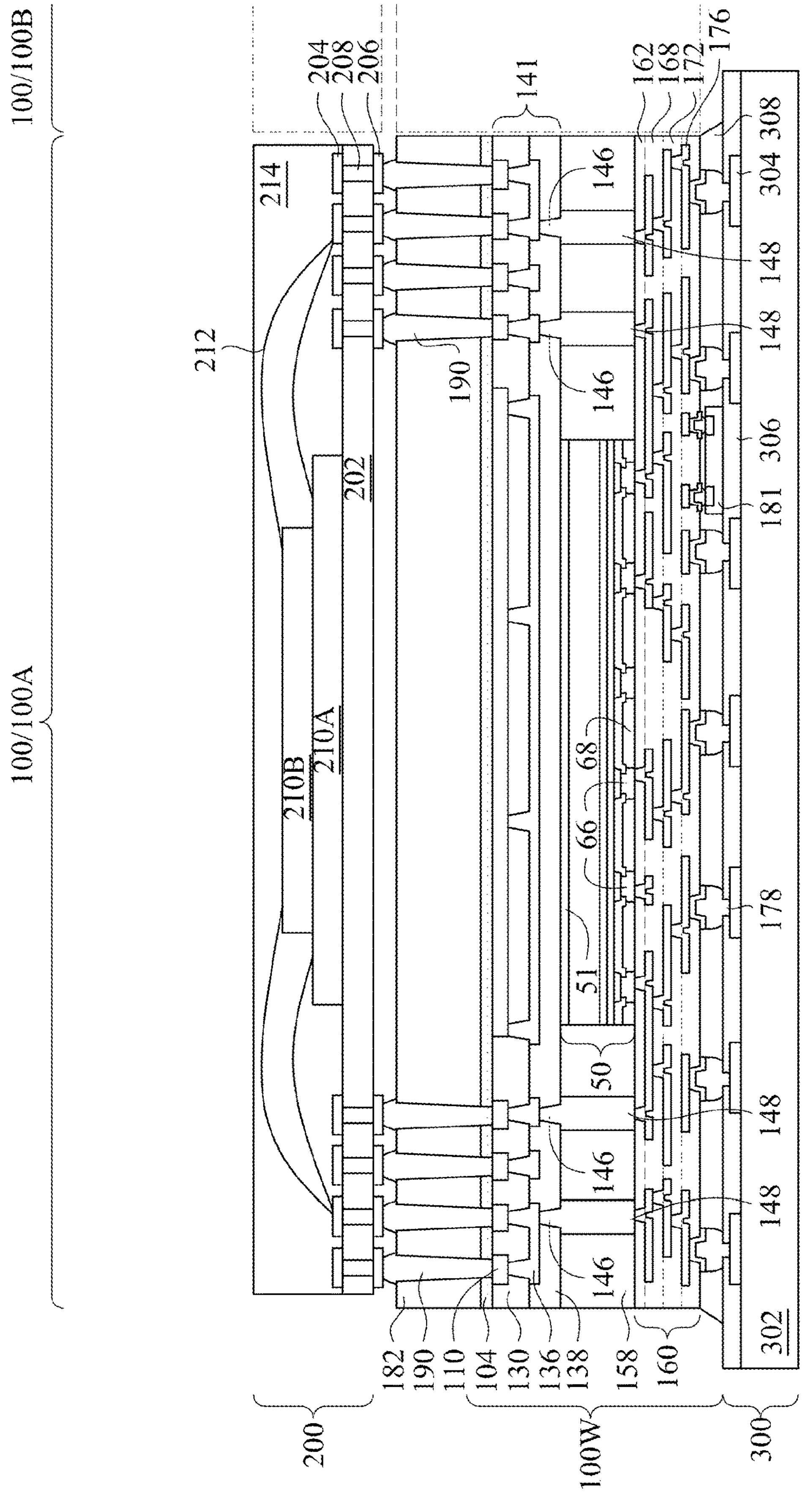
Figure 27:
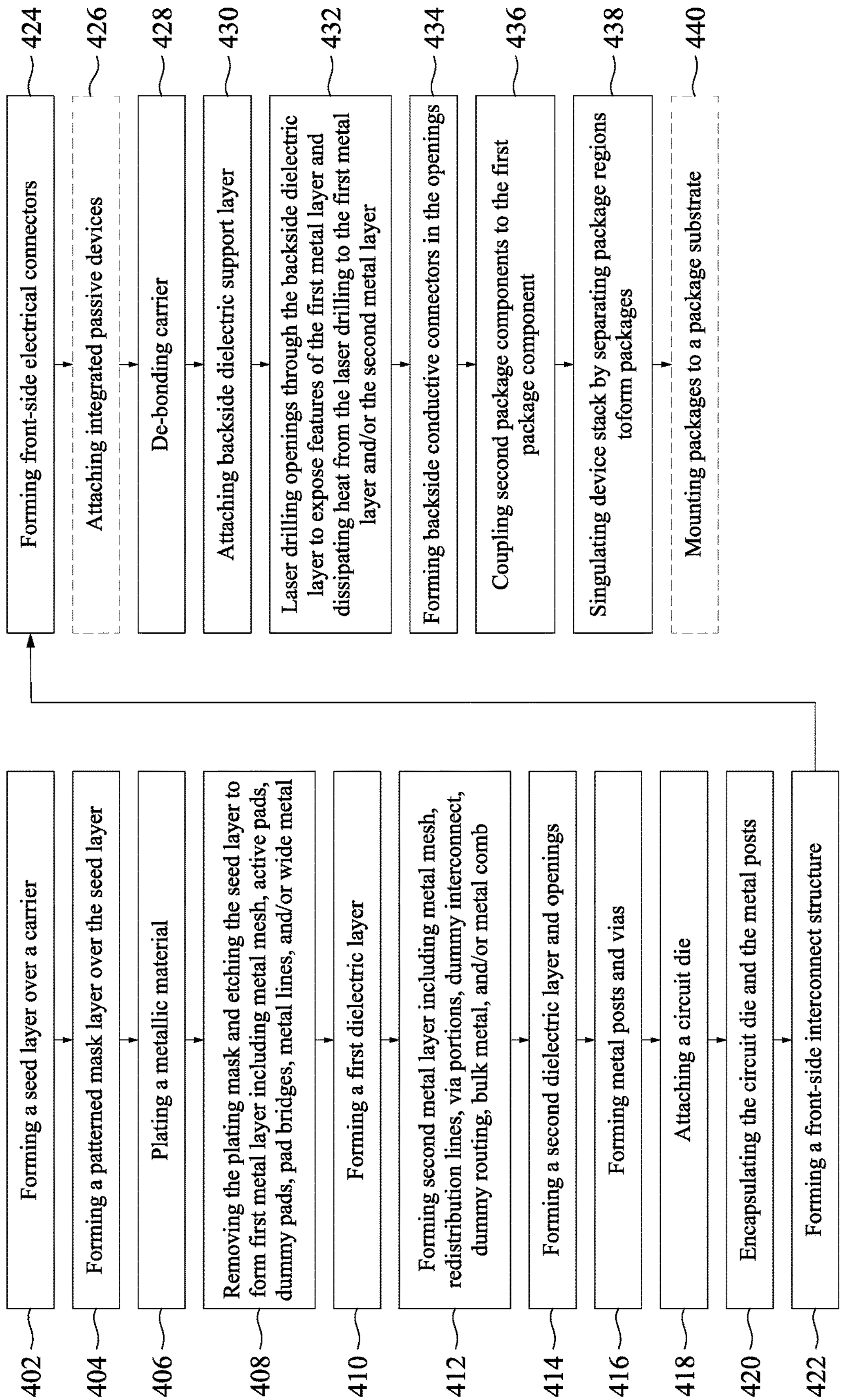
FIG. 27 illustrates a flow diagram for a process of forming a package component, in accordance with some embodiments.

In FIG. 26, each singulated device stack 250 may then be mounted to a package substrate 300 using the conductive connectors 178. The respective process is illustrated as process 440 in the process flow 400 shown in FIG. 27. The package substrate 300 includes a substrate core 302 and bond pads 304 over the substrate core 302. The substrate core 302 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 302 may be an SOI substrate. Generally, an SOI substrate includes a layer of a semiconductor material such as epitaxial silicon, germanium, silicon germanium, SOI, SGOI, or combinations thereof. The substrate core 302 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 302.

The substrate core 302 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 302 may also include metallization layers and vias (not shown), with the bond pads 304 being physically and/or electrically coupled to the metallization layers and vias. The metallization layers may be formed over the active and passive devices and are designed to connect the various devices to form functional circuitry. The metallization layers may be formed of alternating layers of dielectric material (e.g., low-k dielectric material) and conductive material (e.g., copper) with vias interconnecting the layers of conductive material and may be formed through any suitable process (such as deposition, damascene, dual damascene, or the like). In some embodiments, the substrate core 302 is substantially free of active and passive devices.

In some embodiments, the conductive connectors 178 are reflowed to attach the first package component 100 to the bond pads 304. The conductive connectors 178 electrically and/or physically couple the package substrate 300, including metallization layers in the substrate core 302, to the first package component 100. In some embodiments, a solder resist 306 is formed on the substrate core 302. The conductive connectors 178 may be disposed in openings in the solder resist 306 to be electrically and mechanically coupled to the bond pads 304. The solder resist 306 may be used to protect areas of the substrate core 302 from external damage.

The conductive connectors 178 may have an epoxy flux (not shown) formed thereon before they are reflowed with at least some of the epoxy portion of the epoxy flux remaining after the first package component 100 is attached to the package substrate 300. This remaining epoxy portion may act as an underfill to reduce stress and protect the joints resulting from reflowing the conductive connectors 178. In some embodiments, an underfill 308 may be formed between the first package component 100 and the package substrate 300 and surrounding the conductive connectors 178. The underfill 308 may be formed by a capillary flow process after the first package component 100 is attached or may be formed by a suitable deposition method before the first package component 100 is attached.

In some embodiments, passive devices (e.g., surface mount devices (SMDs), such as the IPD 181 may also be attached to the first package component 100 or to the package substrate 300 (e.g., to the bond pads 304). For example, the passive devices may be bonded to a same surface of the first package component 100 or the package substrate 300 as the conductive connectors 178. The passive devices may be attached to the first package component 100 prior to mounting the first package component 100 on the package substrate 300, or may be attached to the package substrate 300 prior to or after mounting the first package component 100 on the package substrate 300.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. Embodiments provide metal features which help dissipate heat generated from a laser drilling process for exposing dummy pads through a dielectric layer. Because the dummy pads are coupled to the metal features, the metal features act as a heat dissipation feature to pull heat from the dummy pad. As a result, reduction in heat is achieved at the dummy pad which reduces or eliminates delamination between the dummy pad and the surrounding dielectric materials. The metal features may include a variety of features, including features disposed in the same metallization layer as the dummy pad, such as a wide metal coupled to the dummy pad by metal bridges or a metal mesh coupled to the dummy pad by an interconnect. The metal features may also include features disposed in another metallization layer of the interconnect structure, including a metal mesh, a dummy interconnect (coupling together at least one other dummy pad), a dummy wire routing, a bulk metal, and a metal comb, which may be connected to the dummy pad using a metal via and optionally a feature interconnect to couple the metal via to the metal features.

One embodiment is a method including forming a first dielectric layer over a carrier. The method also includes forming a first metal layer over the first dielectric layer, the first metal layer including a dummy pad and an active pad. The method also includes forming a second dielectric layer over the first metal layer. The method also includes forming a second metal layer over the first dielectric layer, where the dummy pad of the first metal layer is physically coupled to the second metal layer. The method also includes forming a third dielectric layer over the first metal layer. The method also includes attaching a device die over the third dielectric layer. The method also includes laser drilling an opening in the first dielectric layer to expose the dummy pad. The method also includes, while laser drilling the opening, dispersing heat from the laser drilling to the second metal layer by a metal connection between the first metal layer and the second metal layer. In an embodiment, the method further includes: attaching a supporting dielectric layer to the first dielectric layer prior to the laser drilling, the supporting dielectric layer having a thickness greater than 30 μm. In an embodiment, the first metal layer includes a metal mesh aligned to the device die. In an embodiment, forming the first metal layer includes forming a wide metal, the method further including: attaching the dummy pad to the wide metal by one or more bridge metals, the one or more bridge metals physically coupling a side of the dummy pad with a side of the wide metal. In an embodiment, forming the second metal layer includes forming a via coupling the dummy pad to the second metal layer, and forming one or more heat dispersion features, the one or more heat dispersion features including a metal mesh, a dummy interconnect, a dummy routing, or a metal comb. In an embodiment, a first heat dispersion feature of the one or more heat dispersion features in the second metal layer is physically coupled to a second heat dispersion feature of the first metal layer. In an embodiment, the second heat dispersion feature is a second metal mesh or a wide metal. In an embodiment, the package is electrically coupled to the device die by a second connector coupled to the active pad.

Another embodiment is a method including forming a first metallization layer over a carrier, the first metallization layer including a first set of pads and a second set of pads, each pad of the first set of pads being an active pad, each pad of the second set of pads being a dummy pad. The method also includes forming a first dielectric layer over the first metallization layer. The method also includes forming a second metallization layer over the first dielectric layer, where each pad of the second set of pads are coupled by a metal connection to a common metal feature in the second metallization layer and/or the first metallization layer. The method also includes forming a second dielectric layer over the second metallization layer. The method also includes encapsulating a device die and a metal pillar in an encapsulant disposed over the second dielectric layer. The method also includes forming a front side interconnect over the encapsulant. The method also includes forming first connectors over the front side interconnect. In an embodiment, the common metal feature includes a wide metal disposed in the first metallization layer, where the metal connection bridges a portion of the second set of pads to the wide metal. In an embodiment, the common metal feature includes a dummy interconnect, a dummy routing, a metal mesh, or a dummy comb, and the metal connection includes a through via extending through the first dielectric layer. In an embodiment, the metal connection further includes a feature interconnect, the feature interconnect coupling a first common metal feature to a second common metal feature. In an embodiment, the common metal feature includes a first wire mesh disposed in the first metallization layer. In an embodiment, the common metal feature electrically floats. In an embodiment, the method further includes: removing the carrier; laser drilling through a third dielectric layer to expose the second set of pads through a set of openings, the laser drilling generating heat; and dispersing the heat through the metal connection to the common metal feature.

Another embodiment is a device, the device including an embedded die and a front side interconnect disposed over a front of the embedded die. The device also includes a backside interconnect disposed over a back of the embedded die. The device also includes front connectors disposed on the front side interconnect. The device also includes back connectors disposed on the backside interconnect. The device also includes a first connector of the back connectors extending through a first dielectric layer and attached to a first dummy pad. The device also includes a second connector of the back connectors extending through the first dielectric layer and attached to a second dummy pad. The device also includes a common metal feature connected to the first dummy pad and the second dummy pad. In an embodiment, the common metal feature includes one or more of a metal mesh, a wide metal, a dummy interconnect, a dummy routing, or a metal comb. In an embodiment, the device further includes: a first via, the first via coupling the first dummy pad to a first metallization layer of the backside interconnect, the first metallization layer including the common metal feature. In an embodiment, the device further includes: a first metallization including the first dummy pad, the second dummy pad, and a first metal mesh aligned over the embedded die; a second metallization including a second metal mesh and a first interconnect, the first interconnect coupled to the first dummy pad by a first via and to the second metal mesh, the second metal mesh coupled to the first metal mesh by a second via. In an embodiment, the common metal feature is in a same metallization layer as the first dummy pad and the second dummy pad, the common metal feature including a wide metal; and a set of conductive bridges, each one of the set of conductive bridges connecting the first dummy pad or the second dummy pad to the wide metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a first dielectric layer over a carrier;

forming a first metal layer over the first dielectric layer, the first metal layer including a dummy pad and an active pad;

forming a second dielectric layer over the first metal layer;

forming a second metal layer over the second dielectric layer, wherein the dummy pad of the first metal layer is physically coupled to the second metal layer;

forming a third dielectric layer over the second metal layer;

attaching a device die over the third dielectric layer;

laser drilling an opening in the first dielectric layer to expose the dummy pad; and while laser drilling the opening, dispersing heat from the laser drilling to the second metal layer by a metal connection between the first metal layer and the second metal layer.

2. The method of claim 1, further comprising:

attaching a supporting dielectric layer to the first dielectric layer prior to the laser drilling, the supporting dielectric layer having a thickness greater than 30 μm.

3. The method of claim 1, wherein the first metal layer includes a metal mesh aligned to the device die.

4. The method of claim 1, wherein forming the first metal layer includes forming a wide metal, further comprising: attaching the dummy pad to the wide metal by one or more bridge metals, the one or more bridge metals physically coupling a side of the dummy pad with a side of the wide metal.

5. The method of claim 1, wherein forming the second metal layer includes forming a via coupling the dummy pad to the second metal layer, and forming one or more heat dispersion features, the one or more heat dispersion features comprising a metal mesh, a dummy interconnect, a dummy routing, or a metal comb.

6. The method of claim 5, wherein a first heat dispersion feature of the one or more heat dispersion features in the second metal layer is physically coupled to a second heat dispersion feature of the first metal layer.

7. The method of claim 6, wherein the second heat dispersion feature is a second metal mesh or a wide metal.

8. The method of claim 1, further comprising:

forming a first connector in the opening; and bonding a package to the first connector, wherein the package is electrically coupled to the device die by a second connector coupled to the active pad.

9. A method comprising:

forming a first metallization layer over a carrier, the first metallization layer including a first set of pads and a second set of pads, each pad of the first set of pads being an active pad, each pad of the second set of pads being a dummy pad;

forming a first dielectric layer over the first metallization layer;

forming a second metallization layer over the first dielectric layer, wherein each pad of the second set of pads is coupled by a metal connection to a common metal feature in the second metallization layer and/or the first metallization layer;

forming a second dielectric layer over the second metallization layer;

encapsulating a device die and a metal pillar in an encapsulant disposed over the second dielectric layer;

forming a front side interconnect over the encapsulant; and forming first connectors over the front side interconnect.

10. The method of claim 9, wherein the common metal feature comprises a wide metal disposed in the first metallization layer, wherein the metal connection bridges a portion of the second set of pads to the wide metal.

11. The method of claim 9, wherein the common metal feature comprises a dummy interconnect, a dummy routing, a metal mesh, or a dummy comb, and wherein the metal connection includes a through via extending through the first dielectric layer.

12. The method of claim 11, wherein the metal connection further includes a feature interconnect, the feature interconnect coupling a first common metal feature to a second common metal feature.

13. The method of claim 9, wherein the common metal feature includes a first wire mesh disposed in the first metallization layer.

14. The method of claim 9, wherein the common metal feature electrically floats.

15. The method of claim 9, further comprising:

removing the carrier;

laser drilling through a third dielectric layer to expose the second set of pads through a set of openings, the laser drilling generating heat; and dispersing the heat through the metal connection to the common metal feature.

16. A device comprising:

an embedded die;

a front side interconnect disposed over a front of the embedded die;

a backside interconnect disposed over a back of the embedded die;

front connectors disposed on the front side interconnect;

back connectors disposed on the backside interconnect;

a first connector of the back connectors extending through a first dielectric layer and attached to a first dummy pad;

a second connector of the back connectors extending through the first dielectric layer and attached to a second dummy pad; and a common metal feature connected to the first dummy pad and the second dummy pad.

17. The device of claim 16, wherein the common metal feature comprises one or more of a metal mesh, a wide metal, a dummy interconnect, a dummy routing, or a metal comb.

18. The device of claim 16, further comprising:

a first via, the first via coupling the first dummy pad to a first metallization layer of the backside interconnect, the first metallization layer including the common metal feature.

19. The device of claim 16, further comprising:

a first metallization comprising the first dummy pad, the second dummy pad, and a first metal mesh aligned over the embedded die; and a second metallization comprising a second metal mesh and a first interconnect, the first interconnect coupled to the first dummy pad by a first via and to the second metal mesh, the second metal mesh coupled to the first metal mesh by a second via.

20. The device of claim 16, wherein the common metal feature is in a same metallization layer as the first dummy pad and the second dummy pad, the common metal feature including a wide metal; and a set of conductive bridges, each one of the set of conductive bridges connecting the first dummy pad or the second dummy pad to the wide metal.

* * * * *